(12) United States Patent
Kashihara

(10) Patent No.: US 9,558,830 B2
(45) Date of Patent: Jan. 31, 2017

(54) SEMICONDUCTOR DEVICE

(71) Applicant: Renesas Electronics Corporation, Tokyo (JP)

(72) Inventor: Yoji Kashihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/961,643

(22) Filed: Dec. 7, 2015

(65) Prior Publication Data
US 2016/0225453 A1    Aug. 4, 2016

(30) Foreign Application Priority Data
Jan. 29, 2015    (JP) .................................. 2015-015616

(51) Int. Cl.
G11C 11/34    (2006.01)
G11C 16/08    (2006.01)
G11C 16/26    (2006.01)
G11C 16/14    (2006.01)
G11C 16/12    (2006.01)

(52) U.S. Cl.
CPC ............... *G11C 16/08* (2013.01); *G11C 16/12* (2013.01); *G11C 16/14* (2013.01); *G11C 16/26* (2013.01)

(58) Field of Classification Search
CPC ....... G11C 8/10; G11C 11/1653; G11C 7/1045

USPC .......................... 365/185.13, 189.14, 230.06
See application file for complete search history.

(56) References Cited

U.S. PATENT DOCUMENTS

| | | | |
|---|---|---|---|
| 6,344,764 B2 * | 2/2002 | Tanzawa .......................... 326/68 |
| 6,483,766 B2 * | 11/2002 | Lee ........................... G11O 5/14 |
| | | | 365/230.06 |
| 7,257,031 B2 * | 8/2007 | Darrer .................... G11C 16/12 |
| | | | 365/185.23 |
| 8,483,004 B2 | 7/2013 | Ito | |

FOREIGN PATENT DOCUMENTS

JP    2011-165269 A    8/2011

* cited by examiner

*Primary Examiner* — Han Yang
(74) *Attorney, Agent, or Firm* — McGinn IP Law Group, PLLC

(57) ABSTRACT

The number of level shifters is reduced in a decode circuit of a nonvolatile memory. A semiconductor device is configured with an electrically rewritable nonvolatile memory cell array, and a decode circuit which generates a selection signal to select a driver for a memory gate line (word line). The decode circuit includes a level shifter to step up a signal after predecode. The selection signal is generated by decoding predecode signals which are stepped up by the level shifter in the logical operation circuit. A logic gate to invert the logical level of the predecode signal depending on an operation mode is provided in the preceding stage of each level shifter. When decoding the stepped-up predecode signal, the logical operation circuit performs a different logical operation depending on the operation mode.

11 Claims, 21 Drawing Sheets

FIG. 1
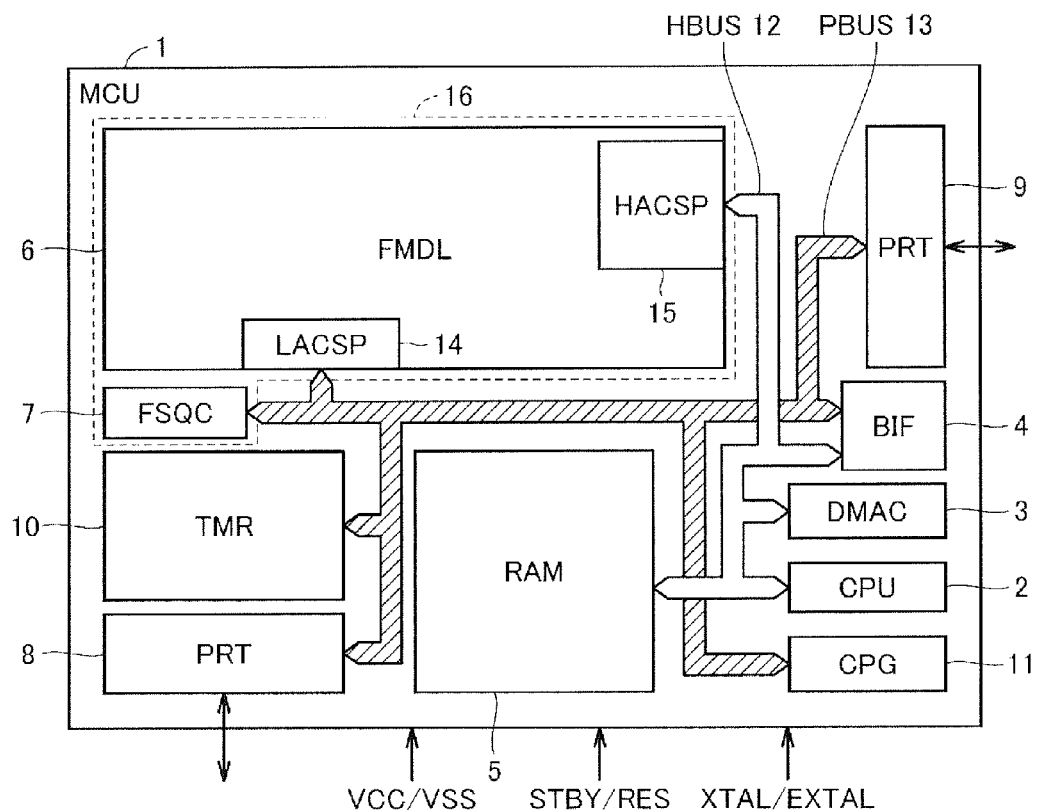
FIG. 2A
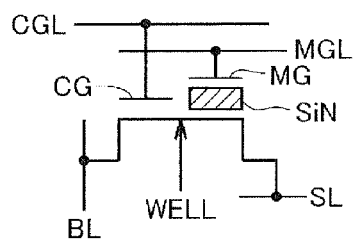
FIG. 2B
|  | BL | CG | MG | SL | WELL |
|---|---|---|---|---|---|
| READ | 1.5V | 1.5V | 0V | 0V | 0V |
| WRITE | 0.8V | 1.0V | 6.4~11V | 3.2~7.0V | 0V |
| ERASING | OPEN | 0V | −3.3~−8.0V | 3.2~7.0V | 0V |

FIG. 8

| DECODER | CIRCUIT | POWER SUPPLY POTENTIAL | | WRITE | ERASING | READ |
|---|---|---|---|---|---|---|
| MGBP DECODER 54P | LEVEL SHIFTER 511 | HIGH SIDE | VMGBPP | 6.4~11V | 1.5V | 1.5V |
| | HIGH VOLTAGE AND CIRCUIT 512 | LOW SIDE | VMGBPN | 3.5V | 0V | |
| MGBN DECODER 54N | LEVEL SHIFTER 521 | HIGH SIDE | VMGBNP | 3.5V | 1.5V | |
| | HIGH VOLTAGE LOGIC CIRCUIT 522 | LOW SIDE | VMGBNN | 1.5V | -3.3~-8V | 0V |
| MGP DECODER 53P | LEVEL SHIFTER 531 | HIGH SIDE | VMGPP | 6.4~11V | 1.5V | 1.5V |
| | HIGH VOLTAGE AND CIRCUIT 532 | LOW SIDE | VMGPN | 3.5V | 0V | |
| MGN DECODER 53N | LEVEL SHIFTER 541 | HIGH SIDE | VMGNP | 3.5V | 0V | 1.5V |
| | HIGH VOLTAGE LOGIC CIRCUIT 542 | LOW SIDE | VMGNN | 1.5V | -3.3~-8V | |
| MGG DECODER 53G | LEVEL SHIFTER 551 | HIGH SIDE | VMGGP | 6.4~11V | 1.5V | 1.5V |
| | HIGH VOLTAGE LOGIC CIRCUIT 552 | LOW SIDE | VMGGN | 3.5V | -3.3~-8V | |

FIG. 17

| | | |
|---|---|---|
| (A) | SELECTED BLOCK /SELECTED CELL (ERASING) | CG: 0V, MG: −3.3∼−8V (VMGBNN), SL: 3.2∼7.0V, BL: OPEN |
| (B) | SELECTED BLOCK /UN-SELECTED CELL (NON-ERASING) | CG: 0V, MG: 1.5V (VMGBPP), SL: 3.2∼7.0V, BL: OPEN |
| (C) | UN-SELECTED BLOCK /SELECTED CELL (NON-ERASING) | NO STATE |
| (D) | UN-SELECTED BLOCK /UN-SELECTED CELL (NON-ERASING) | CG: 0V, MG: 1.5V (VMGBPP), BL: 0V, SL: 0V |

SEMICONDUCTOR DEVICE

CROSS-REFERENCE TO RELATED APPLICATIONS

The disclosure of Japanese Patent Application No. 2015-015616 filed on Jan. 29, 2015 including the specification, drawings and abstract is incorporated herein by reference in its entirety.

BACKGROUND

The present invention relates to a semiconductor device, and is employed suitably for a semiconductor device provided with a nonvolatile memory, for example.

In a nonvolatile memory, a high voltage is applied to a word line (or a memory gate line) in writing and erasing data. Therefore, when decoding an address signal of a low voltage system and supplying it to a word line, it is necessary to convert the level of the decoded signal from a low voltage to a high voltage.

For example, Japanese Unexamined Patent Application Publication No. 2011-165269 (Patent Literature 1) provides a level shifter just before an input node of a gate control signal of a driver coupled to each memory gate line. Although not shown, a level shifter is also provided just before an input node of a power supply signal of a driver coupled to each memory gate line. In this case, the level shifters are provided as many as the number of the gate control signals of the word line driver and the number of the power supply lines.

(Patent Literature 1) Japanese Unexamined Patent Application Publication No. 2011-165269

SUMMARY

A level shifter generally requires a large layout area; therefore, it is desirable to reduce the number of level shifters as much as possible for the reduction of the occupied area of the circuit. As one of the solutions, it is possible to consider a method in which the level conversion of a low voltage signal before decoding is performed and the decoding is performed by the logical operation of a high voltage address signal after the level conversion. However, in a nonvolatile memory, in addition to a positive high voltage signal, a negative high voltage signal is also required for the signals to be supplied to a word line (or a memory gate line). Therefore, in a decode circuit for a nonvolatile memory, it is not possible to employ the same logical operation circuit as one employed in the single power supply system which uses only a positive high voltage signal.

The other issues and new features of the present invention will become clear from the description of the present specification and the accompanying drawings.

A semiconductor device according to one embodiment is configured with an electrically rewritable nonvolatile memory cell array and a decode circuit which generates a selection signal to select a word line driver. The decode circuit includes a level shifter to step up the signal after predecode. The predecode signal stepped up by the level shifter is decoded in a logical operation circuit to generate the selection signal. A logic gate is provided in the preceding stage of each level shifter in order to invert the logical level of the predecode signal according to an operation mode. The logical operation circuit performs a different logical operation according to the operation mode when decoding the stepped-up predecode signal.

According to the above-described embodiment, it is possible to reduce the number of the level shifters in the decode circuit of the nonvolatile memory.

BRIEF DESCRIPTION OF THE DRAWINGS

FIG. 1 is a block diagram illustrating the configuration of a semiconductor device according to Embodiment 1;

FIG. 2A and FIG. 2B are drawings illustrating the configuration and operation of a memory cell employed in a flash memory module illustrated in FIG. 1;

FIG. 8 is a drawing in a tabular form illustrating an example of the power supply potential supplied to a circuit of a high voltage system in the MG decoder unit illustrated in FIG. 5;

FIG. 17 is a schematic drawing illustrating a bias state of a selected/un-selected memory cell in erasing;

DETAILED DESCRIPTION

Figure 3:
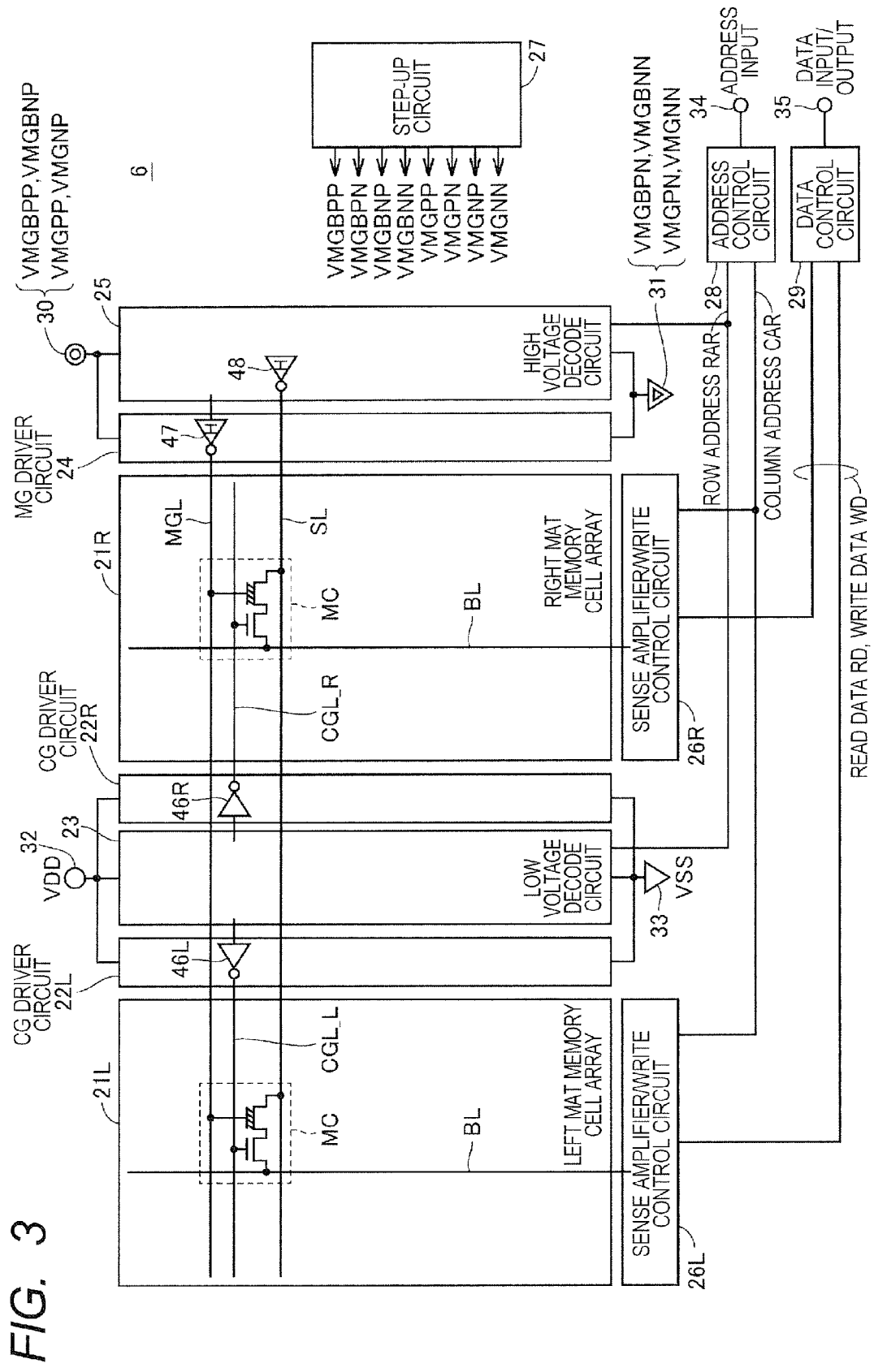
FIG. 3 is a block diagram illustrating the configuration of the flash memory module illustrated in FIG. 1.

Hereinafter, each embodiment is described in detail with reference to accompanying drawings. In the following, the

Embodiment 1

The Entire Configuration of a Semiconductor Device

FIG. 1 is a block diagram illustrating the configuration of a semiconductor device according to Embodiment 1. FIG. 1 illustrates the configuration of a micro controller unit (MCU) 1 as an example of the semiconductor device.

With reference to FIG. 1, the micro controller unit 1 is formed in one semiconductor chip such as single crystal silicon by employing a CMOS (Complementary Metal Oxide Semiconductor) integrated circuit manufacturing technology, for example.

As illustrated in FIG. 1, the micro controller unit 1 includes a central processing unit (CPU) 2, a random access memory (RAM) 5, and a flash memory module (FMDL) 6. The central processing unit 2 includes an instruction controlling part and an execution part, and executes an instruction. The random access memory 5 is used for a work space of the central processing unit 2. The flash memory module 6 is provided as a nonvolatile memory module to store data and a program.

The micro controller unit 1 further includes a direct memory access controller (DMAC) 3, a bus interface circuit (BIF) 4, a flash sequencer (FSQC) 7, an external I/O ports (PRT) 8 and 9, a timer (TMR) 10, a clock pulse generator (CPG) 11, a high speed bus (HBUS) 12, and a peripheral bus (PBUS) 13.

The bus interface circuit 4 performs bus interface control or bus bridge control between the high speed bus 12 and the peripheral bus 13. The flash sequencer 7 performs command access control to the flash memory module (FMDL) 6. The clock pulse generator 11 creates an internal clock CLK for controlling the micro controller unit 1.

Although not limited in particular, the bus architecture of the micro controller unit 1 in the case of FIG. 1 has a high speed bus (HBUS) 12 and a peripheral bus (PBUS) 13. Although not limited in particular, each of the high speed bus 12 and the peripheral bus 13 has a data bus, an address bus, and a control bus. By providing two buses of the high speed bus 12 and the peripheral bus 13, it is possible to mitigate the load of the bus and to guarantee a high-speed access operation, compared with the case where all the circuits are coupled to a common bus.

To the high speed bus 12, the central processing unit 2, the direct memory access controller 3, the bus interface circuit 4, the random access memory 5, and the flash memory module 6 are coupled. To the peripheral bus 13, the flash sequencer 7, the external I/O ports 8 and 9, the timer 10, and the clock pulse generator 11 are coupled.

The microcomputer 1 further includes a clock terminal XTAL/EXTAL to which an oscillator is coupled or an external clock is supplied, an external hardware standby terminal STB for indicating a standby state, an external reset terminal RES for indicating a reset, an external power terminal VCC, and an external ground terminal VSS.

In FIG. 1, the flash sequencer 7 as a logic circuit and a flash memory module 6 formed in an array are designed using different CAD tools. Accordingly, they are shown as separate circuit blocks for convenience. However, they configure a flash memory 16 in combination.

The flash memory module 6 is coupled to the high speed bus (HBUS) 12 via the read-only high-speed access port (HACSP) 15. The CPU 2 or the DMAC 3 can read-access the flash memory module 6 via the high-speed access port 15 from the high speed bus 12. When the CPU 2 or the DMAC 3 write-accesses and initializes the flash memory module 6, they issue a command to the flash sequencer 7 via the peripheral bus (PBUS) 13 through the intermediary of the bus interface circuit 4. Responding to this command, the flash sequencer 7 performs control of the initialization and the writing operation to the flash memory module, via a low-speed access port (LACSP) from the peripheral bus PBUS.

[A Configuration Example and Operation of a Memory Cell]

FIG. 2A and FIG. 2B illustrate the configuration and operation of a memory cell employed in the flash memory module 6 illustrated in FIG. 1. In the present embodiment, the explanation is made for the case where the memory cell is configured with a split gate type nonvolatile memory element as illustrated in FIG. 2, as an example. However, the driver circuit explained in the present embodiment is applicable also in the case of a stacked gate type nonvolatile memory element.

With reference to FIG. 2A, the split gate type nonvolatile memory element includes a control gate CG and a memory gate MG which are arranged over a channel forming region between a source region and a drain region via a gate insulating film. A charge trapping region such as a silicon nitride (SiN) is arranged between the memory gate MG and the gate insulating film. A control gate CG is coupled to a control gate line CGL (also called a "read word line"), and a memory gate MG is coupled to a memory gate line MGL (also called a "rewrite word line"). A drain region (or a source region) on the side of the control gate CG is coupled to a bit line BL, and a source region (or a drain region) on the side of the memory gate MG is coupled to a source line SL.

FIG. 2B illustrates an example of the voltage setup at the bit line BL, the control gate CG, the memory gate MG, the source line SL, and a well region (WELL), in reading, writing, and erasing of the split gate type nonvolatile memory element. As illustrated in FIG. 2B, a positive high voltage with respect to the well region is applied to the memory gate of the memory cell as a write target, and a negative high voltage with respect to the well region is applied to the memory gate of the memory cell as an erasing target. The "high voltage" indicates that the absolute value of the potential difference (a potential difference between the memory gate and the well region in the above-described case) is greater than the power supply voltage level in reading (VDD level). The high voltage is also called a step-up voltage.

Specifically, in order to decrease the threshold voltage Vth of a memory cell (in erasing), the bit line BL is set as a uncoupled state (OPEN), the control gate CG is set at 0V, and the memory gate MG is set at −3.3 to −8.0V, for example. According to the voltage of the memory gate MG, the source line SL is set at 3.2 to 7.0V and the well region WELL is set at 0V. Accordingly, out of electrons and electron holes which are generated by a high electric field between the well region (WELL) and the memory gate MG, electron holes are injected into the charge trapping region (SiN) from the well region (WELL). This processing is performed in units of plural memory cells which share a memory gate line.

In order to increase the threshold voltage Vth of a memory cell (in writing), the bit line is set at 0.8V, the control gate CG is set at 1.0V, and the memory gate MG is set at 6.4 to 11V, for example. According to the voltage of the memory gate MG, the source line SL is set at 3.2 to 7.0V and the well region WELL is set at 0V. In this case, when write current flows from the source line SL to the bit line BL, a hot electron is generated in the boundary portion of the control gate CG and the memory gate MG, and the generated hot electron is injected into the charge trapping region (SiN). Since the injection of an electron is decided depending on whether a bit-line current is flowed, this processing is controlled in units of bits.

In reading, the bit line BL is set at 1.5V, the control gate CG is set at 1.5V, the memory gate MG is set at 0V, the source line SL is set at 0V, and the well region WELL is set at 0V, for example. When the threshold voltage Vth of the memory cell is low, the resistance of the memory cell becomes small (ON state), and when the threshold voltage Vth is high, the resistance of the memory cell becomes large (OFF state).

In the stacked gate type nonvolatile memory element, one word line corresponding to both of the rewrite word line and the read word line described above is coupled to the control gate. Also in this case, in order to increase the threshold voltage of a memory cell, a positive high voltage with respect to the well region is similarly applied to the control gate (word line). On the contrary, in order to decrease the threshold voltage of the memory cell, a negative high voltage with respect to the well region is applied to the control gate (word line).

[A Flash Memory Module]

FIG. 3 is a block diagram illustrating the configuration of the flash memory module (FMDL) 6 illustrated in FIG. 1. In the following explanation, the right and left direction of the space of FIG. 3 is called a row direction and the up and down direction of the space is called a column direction.

As illustrated in FIG. 3, the flash memory module (FMDL) 6 includes a left mat memory cell array 21L, a right mat memory cell array 21R, a sense amplifier/write control circuit 26L for the left mat memory cell array 21L, a sense amplifier/write control circuit 26R for the right mat memory cell array 21R, an address control circuit 28, and a data control circuit 29. The flash memory module (FMDL) 6 further includes a CG driver circuit 22L for the left mat memory cell array 21L, a CG driver circuit 22R for the right mat memory cell array 21R, a low voltage decode circuit 23, an MG driver circuit 24, a high voltage decode circuit 25, and a step-up circuit 27.

FIG. 3 illustrates an example of a two-mat configuration in which the memory cell array is split into two at the center. In cases where speediness is not considered as important, it is also possible to adopt the memory cell array of a one-mat configuration. In the one-mat configuration, the CG driver circuits 22L and 22R are combined to one, and are arranged at the left end or the right end of the memory cell array.

With reference to FIG. 3, each of the left mat memory cell array 21L and the right mat memory cell array 21R includes plural memory cells MC arranged in a matrix. The memory cells MC are the split gate type nonvolatile memory explained in FIG. 2. In the following explanation, the left mat memory cell array 21L may be written simply as a left memory mat 21L or a left mat 21L, and the right mat memory cell array 21R may be written simply as a right memory mat 21R or a right mat 21R.

The bit line BL is arranged for every column of the left memory mat 21L and the right memory mat 21R. As explained in FIG. 2, each bit line BL is coupled to the source or drain region on the side of the control gate CG of each memory cell MC provided in the corresponding column.

The source line SL is arranged for every row of the memory mats 21L and 21R in common to both the left memory mat 21L and the right memory mat 21R. As explained in FIG. 2, each source line SL is coupled to the source or drain region on the side of the memory gate MG of each memory cell MC provided in the corresponding row.

The control gate line CGL is individually provided for every memory mat. A control gate line CGL_L is arranged for every row of the left memory mat 21L, and a control gate line CGL_R is arranged for every row of the right memory mat 21R. Each control gate line CGL_L is coupled to the control gate CG of each memory cell MC provided in the corresponding row of the left memory mat 21L. Similarly, each control gate line CGL_R is coupled to the control gate CG of each memory cell MC provided in the corresponding row of the right memory mat 21R.

The memory gate line MGL is arranged for every row of the memory mats 21L and 21R, in common to both of the left memory mat 21L and the right memory mat 21R. As explained in FIG. 2, each memory gate line MGL is coupled to the memory gate MG of each memory cell MC provided in the corresponding row.

In cases where speediness is considered as important, it is possible to adopt the configuration in which the bit lines BL are separated for read and for write, and it is also possible to adopt the configuration in which the bit lines are hierarchized and divided into a main bit line and a sub bit line. In FIG. 2, the source line SL is provided for every row. However, it is also possible to adopt the configuration in which one source line SL is shared in plural rows of the unit of rewrite, or it is also possible to adopt the configuration in which the source line is divided into plural source lines SL in one row for the disturb reduction.

The sense amplifier/write control circuit 26L is coupled to the memory cell MC in the left memory mat 21L via the bit line BL and controls the read and rewrite of data of the memory cell MC. Similarly, the sense amplifier/write control circuit 26R is coupled to the memory cell MC in the right memory mat 21R via the bit line BL and controls the read and rewrite of data of the memory cell MC.

The address control circuit 28 fetches an address (a row address RAR and a column address CAR) from the external address input terminal 34. The address control circuit 28 transmits the row address signal RAR to the high voltage decode circuit 25 and the low voltage decode circuit 23, and transmits the column address signal CAR to the sense amplifier/write control circuits 26L and 26R.

The data control circuit 29 outputs read data RD outputted from the sense amplifier/write control circuits 26L and 26R to the external data input/output terminal 35, and outputs write data WD inputted to the external data input/output terminal 35 to the sense amplifier/write control circuits 26L and 26R.

The CG driver circuits 22L and 22R are arranged between the left memory mat 21L and the right memory mat 21R. Specifically, the CG driver circuit 22L is arranged adjoining the right-hand side of the left memory mat 21L. The CG driver circuit 22R is arranged adjoining the left-hand side of the right memory mat 21R. The low voltage decode circuit 23 is arranged between the CG driver circuit 22L and the CG driver circuit 22R.

The CG driver circuit 22L includes plural CG drivers 46L which drive respectively plural control gate lines CGL_L mainly used for read. Similarly, the CG driver circuit 22R includes plural CG drivers 46R which drive respectively plural control gate lines CGL_R mainly used for read. Based on the row address signal RAR supplied from the address control circuit 28, the low voltage decode circuit 23 selects a row, and selects and drives the CG drivers 46L and 46R corresponding to the selected row.

The CG driver circuits 22L and 22R and the low voltage decode circuit 23 are respectively supplied with the high-side power supply potential VDD and the low-side power supply potential VSS of the low voltage system, via the power supply terminal 32 on the side of the high potential (also called a "high side") and the power supply terminal 33 on the side of the low potential (also called a "low side"). Here, the "low voltage" indicates the power supply voltage level (VDD level) used in reading.

The MG driver circuit 24 is arranged on the outer side (right-hand side or left-hand side) of the region surrounding both the left memory mat 21L and the right memory mat 21R. In the case of FIG. 3, the MG driver circuit 24 is arranged adjoining the right-hand side of the right memory mat 21R. The MG driver circuit 24 includes plural MG drivers 47 which drive respectively plural memory gate lines MGL used mainly for rewrite (write and erasing).

Based on the row address signal RAR supplied from the address control circuit 28, the high voltage decode circuit 25 selects a row, and selects and derives the MG driver 47 corresponding to the selected row. The high voltage decode circuit 25 further includes an SL driver 48 which drives the source line SL of the selected row.

The step-up circuit 27 generates the high-side power supply potential for rewrite and the low-side power supply potential for rewrite, based on the high-side power supply potential VDD and the low-side power supply potential VSS of the low voltage system. The step-up circuit 27 supplies, to each of the MG driver circuit 24 and the high voltage decode circuit 25, the high-side power supply potentials VMGBPP, VMGBNP, VMGPP, and VBGNP for rewrite via the high-side power supply terminal 30, and the low-side power supply potentials VMGBPN, VMGBNN, VMGPN, and VMGNN for rewrite via the low-side power supply terminal 31.

[An MG Driver]

Figure 4A:
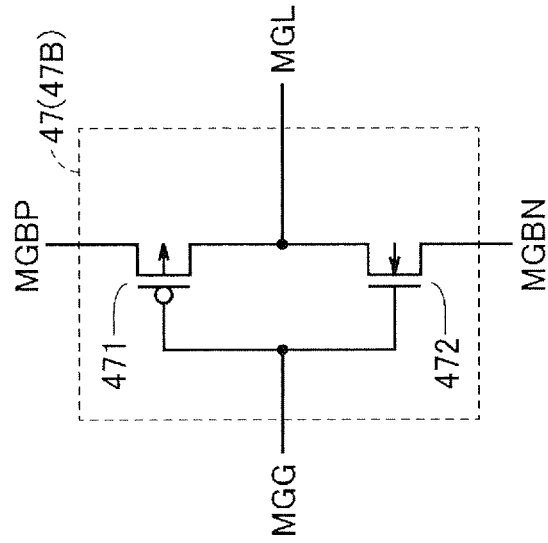
FIG. 4A and FIG. 4B are a circuit diagram illustrating an example of the concrete configuration of an MG driver illustrated in FIG. 3.
Figure 4B:
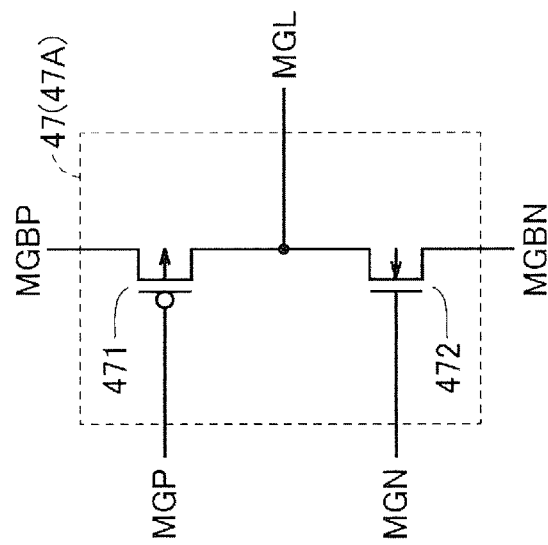

FIG. 4A and FIG. 4B are a circuit diagram illustrating an example of the concrete configuration of an MG driver 47 illustrated in FIG. 3.

With reference to FIG. 4A, the MG driver 47A includes a PMOS (Positive-type Metal Oxide Semiconductor) transistor 471 and an NMOS (Negative-type Metal Oxide Semiconductor) transistor 472 coupled in series between a power supply line MGBP on the high potential side (high side) and a power supply line MGBN on the low potential side (low side), in the direction from the high side to the low side. The gate of the PMOS transistor 471 is coupled to the control signal line MGP, and the gate of the NMOS transistor 472 is coupled to the control signal line MGN. The coupling node of the PMOS transistor 471 and the NMOS transistor 472 is coupled to the memory gate line MGL. The PMOS transistor 471 is employed in order to pull up the potential of the memory gate line MGL, and the NMOS transistor 472 is employed in order to pull down the potential of the memory gate line MGL.

The MG driver 47B illustrated in FIG. 4B has the configuration in which the gate of the PMOS transistor 471 and the gate of the NMOS transistor 472 in the MG driver 47A illustrated in FIG. 4A are coupled to the signal line MGG.

[An MG Decoder Unit]

(Outline)

Figure 5:
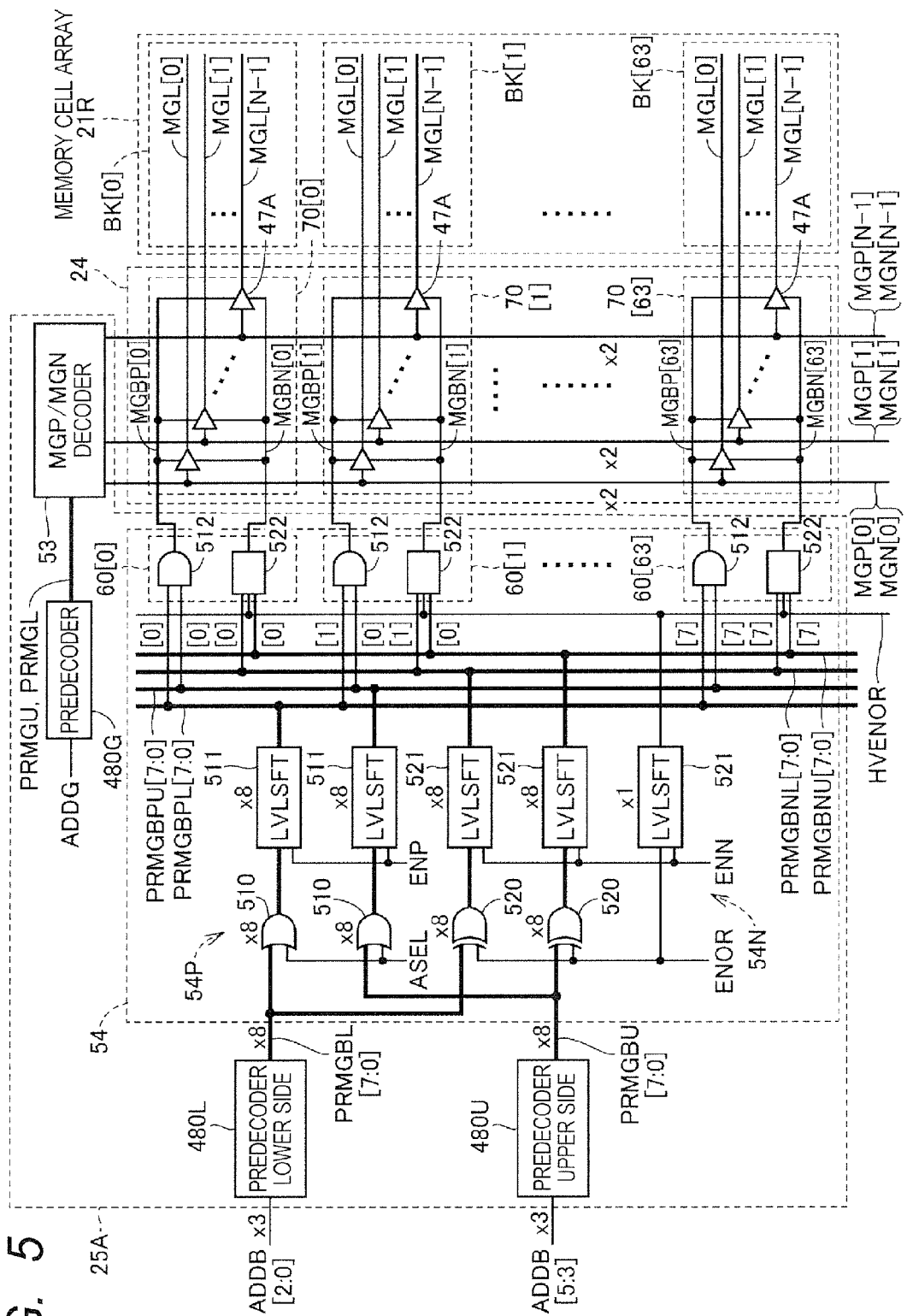
FIG. 5 is a block diagram illustrating the configuration of an MG decoder unit of a high voltage decode circuit illustrated in FIG. 3.

FIG. 5 is a block diagram illustrating the configuration of an MG decoder unit 25A of the high voltage decode circuit 25 illustrated in FIG. 3. FIG. 5 also illustrates an example of the configuration of the right mat memory cell array 21R and the MG driver circuit 24 illustrated in FIG. 3.

As illustrated in FIG. 5, the right mat memory cell array 21R is divided into 64 blocks BK[0]-BK[63]. In each block BK, N rows of memory cells are arranged and N pieces of memory gate lines MGL[0]-MGL[N−1] are wired. The left mat memory cell array 21L also has the same configuration as the right mat memory cell array 21R.

The MG driver circuit 24 includes 64 MG driver groups 70[0]-70[63] respectively corresponding to the blocks BK[0]-BK[63]. Each of the driver groups 70 includes N pieces of MG drivers 47A which drive the N pieces of the memory gate lines MGL, respectively. In each of the driver groups 70, the high-side power supply line MGBP and the low-side power supply line MGBN explained in FIG. 4 are wired.

The MG decoder unit 25A includes predecoders 480L, 480U, and 480G, an MGBP/MGBN decoder 54, and an MGP/MGN decoder 53.

An address signal ADDB[5:0] for 6 bits out of the row address signal RAR outputted from the address control circuit 28 illustrated in FIG. 3 is employed for selecting the block BK[63:0]. An address signal ADDG for the remaining bits is employed for selecting one of N pieces of the memory gate lines MGL[N−1:0] in each block BK.

The predecoder 480U generates eight 1-bit predecode signals PRMGBU[7:0] by decoding the upper-order 3-bit address signal[5:3] of the address signal ADDB[5:0] for selecting the block BK. The predecoder 480L generates eight 1-bit predecode signals PRMGBL[7:0] by decoding the lower-order 3-bit address signal ADDB[2:0].

Although FIG. 5 shows a simplified drawing, the address signal ADDG for selecting the memory gate line BGL is also divided into the upper bits and the lower bits. The predecoder 480G generates a predecode signal PRMGU by decoding the upper-order address signal ADDG, and generates a predecode signal PRMGL by decoding lower-order address signal ADDG.

Based on the predecode signals PRMGBL and PRMGBU outputted from the predecoders 480L and 480U, the MGBP/MGBN decoder 54 supplies the power supply potential necessary for the data rewrite, to the high-side power supply line MGBP and the low-side power supply line MGBN of the MG driver group 70 corresponding to the selected block BK. The high-side power supply line MGBP can be supplied with only a positive high potential; however, the low-side power supply line MGBN can be supplied with a positive high potential and a negative high potential.

Based on the predecode signals PRMGL and PRMGU outputted from the predecoder 480G, the MGP/MGN decoder 53 activates the corresponding memory gate line MGL by outputting a control signal to the control signal lines MGP and MGN coupled to the MG driver 47A. The control signal line MGP is coupled to the gate of the PMOS transistor 471 illustrated in FIG. 4A which configures the corresponding MG driver 47A, and can be supplied with only a positive high potential. The control signal line MGN is coupled to the gate of the NMOS transistor 472 which configures the corresponding MG driver 47A, and can be supplied with a positive high potential and a negative high potential.

(The MGP/MGN Decoder)

As illustrated in FIG. 5, the MGBP/MGBN decoder 54 includes 16 OR gates 510 and 16 EXOR (Exclusive-OR) gates 520 as low voltage logic circuits, 17 level shifters (LVLSFT) 511 and 521, and high voltage decoders 60[0]-60[63].

The level shifter 511 converts an input signal of a VDD level into a signal of a positive high voltage level (a high-side power supply potential VMGBPP; a low-side power supply potential VMGBPN) (a concrete numerical example will be explained in FIG. 8). Each level shifter 511 has a built-in latch circuit for holding an input signal. When a cutoff signal ENP is at an H level, the signal input to the latch circuit is enabled. After cutting off the signal input to the latch circuit by setting the cutoff signal ENP at an L level, the input signal is stepped up to a positive high voltage by changing the power supply potential supplied to the level shifter 511.

Similarly, the level shifter 521 converts the input signal of a VDD level into a signal of a positive or negative high voltage level different from the case of the level shifter 511 (a high-side power supply potential VMGBNP; a low-side power supply potential VMGBNN) (a concrete numerical example will be explained in FIG. 8). Each level shifter 521 has a built-in latch circuit for holding an input signal. When a cutoff signal ENN is at an H level, the signal input to the latch circuit is enabled. After cutting off the signal input to the latch circuit by setting the cutoff signal ENN at an L level, the input signal is stepped up to a positive or negative high voltage by changing the power supply potential supplied to the level shifter 521.

Eight lower-order predecode signals PRMGBL[7:0] outputted from the predecoder 480L are inputted to eight level shifters 511 via eight OR gates 510, respectively. Eight level shifters 511 convert the predecode signal PRMGBL[7:0] of a VDD level into a predecode signal PRMGBPL[7:0] of a high voltage level. Here, each OR gate 510 calculates the logical addition of the corresponding predecode signal PRMGBL[7:0] and an all-selection signal ASEL. Accordingly, when the all-selection signal ASEL is at a high level (H level), all of the predecode signal PRMGBL[7:0] are selected. The all-selection signal is activated (set at an H level) in erasing.

Eight lower-order predecode signals PRMGBL[7:0] are further inputted into eight level shifters 521 via eight EXOR gates 520, respectively. Eight level shifters 521 convert the predecode signal PRMGBL[7:0] of a VDD level into a predecode signal PRMGBNL[7:0] of a high voltage level. Here, each EXOR gate 520 calculates the exclusive OR of the corresponding predecode signal PRMGBL[7:0] and an inversion control signal ENOR. Accordingly, when the inversion control signal ENOR is at an H level, each EXOR gate 520 outputs a signal obtained by inverting the logical level of the corresponding predecode signal PRMGBL[7:0], and when the inversion control signal ENOR is at a low level (L level), each EXOR gate 520 outputs the corresponding predecode signal PRMGBL[7:0] without changing the logical level thereof. The inversion control signal ENOR is set at an H level when the operation mode (write, erasing) of the flash module is the erasing mode, and it is set at an L level when the operation mode is the write mode.

On the other hand, eight upper-order predecode signals PRMGBU[7:0] outputted from the predecoder 480U are inputted into eight level shifters 511 via eight OR gates 510, respectively. Eight level shifters 511 convert the predecode signal PRMGBU[7:0] of a VDD level into a predecode signal PRMGBPU[7:0] of a high voltage level. Here, each OR gate 510 calculates the logical addition of the corresponding predecode signal PRMGBU[7:0] and the all-selection signal ASEL.

Eight upper-order predecode signals PRMGBU[7:0] are further inputted into eight level shifters 521 via eight EXOR gates 520, respectively. Eight level shifters 521 convert the predecode signal PRMGBU[7:0] of a VDD level into a predecode signal PRMGBNU[7:0] of a high voltage level. Here, each EXOR gate 520 calculates the exclusive OR of the corresponding predecode signal PRMGBU[7:0] and an inversion control signal ENOR.

The inversion control signal ENOR of a VDD level is converted into an inversion control signal HVENOR of a high voltage level by the level shifter 521.

The high voltage decoders 60[0]-60[63] are provided respectively corresponding to the MG driver groups 70[0]-70[63]. Specifically, the k-th high voltage decoder 60[$k$] (0≤k≤63) supplies a high-side power supply potential and a low-side power supply potential respectively to the high-side power supply line MGBP[k] and the low-side power supply line MGBN[k] provided in the k-th MG driver group 70[$k$].

Specifically, each of the high voltage decoders 60[0]-60[63] includes a high voltage AND circuit 512 and a high voltage logic circuit 522. The high voltage AND circuit 512 performs the AND operation of each of the eight high voltage predecode signals PRMGBPL[7:0] and each of the eight high voltage predecode signals PRMGBPU[7:0], and generates a power supply potential to be supplied to 64 pieces of the high-side power supply lines MGBP[63:0] provided in the MG driver circuit 24. The high voltage logic circuit 522 performs the logical operation of each of the eight high voltage predecode signals PRMGBNL[7:0] and each of the eight high voltage predecode signals PRMGBNU[7:0], and generates a power supply potential to be supplied to 64 pieces of the low-side power supply lines MGBN [63:0] provided in the MD driver circuit 24. Here, the high voltage logic circuit 522 performs an AND operation when the inversion control signal HVENOR is at an L level, and performs an OR operation when the inversion control signal HVENOR is at an H level.

Specifically, the high voltage AND circuit 512 provided in the (i+8×j)-th high voltage decoder 60[$i$+8×j] (0≤i≤7, 0≤j≤7) is supplied with the i-th predecode signal PRMGBPL[i] of a high voltage level and the j-th predecode signal PRMGBPU[j] of the high voltage level. The high voltage AND circuit 512 performs the AND operation of the supplied predecode signals PRMGBPL[i] and PRMGBPU[j]. The voltage signal (AND operation result) generated by the high voltage AND circuit 512 is supplied to the high-side power supply line MGBP[i+8×j] of the corresponding MG driver group 70[$i$+8×j].

The high voltage logic circuit 522 provided in the (i+8× j)-th high voltage decoder 60[$i$+8×j] (0≤i≤7, 0≤j≤7) is supplied with the i-th predecode signal PRMGBNL[i] of a high voltage level, the j-th predecode signal PRMGBNU[j] of a high voltage level, and a high voltage inversion control signal HVENOR. The high voltage logic circuit 522 performs the AND operation of the supplied predecode signals PRMGBNL[i] and PRMGBNU[j], when the high voltage inversion control signal HVENOR is at an L level. The high voltage logic circuit 522 performs the OR operation of the supplied predecode signals PRMGBNL[i] and PRMGBNU [j], when the high voltage inversion control signal HVENOR is at an H level. The voltage signal (AND operation result or OR operation result) generated by the high voltage logic circuit 522 is supplied to the low-side power supply line MGBN[i+8×j] of the corresponding MG driver group 70[i+8×j].

Among the above-described MGBP/MGBN decoders 54, the OR gate 510, the level shifter 511, and the high voltage AND circuit 512 related to the output of the power supply potential to the high-side power supply line MGBP[63:0] of the MG driver circuit 24 are collectively called an MGBP decoder 54P. Similarly, the EXOR gate 520, the level shifter 521, and the high voltage logic circuit 522 related to the output of the power supply potential to the low-side power supply line MGBN of the MD driver circuit 24[63:0] are collectively called an MGBN decoder 54N.

(The MGP/MGN Decoder)

Figure 6:
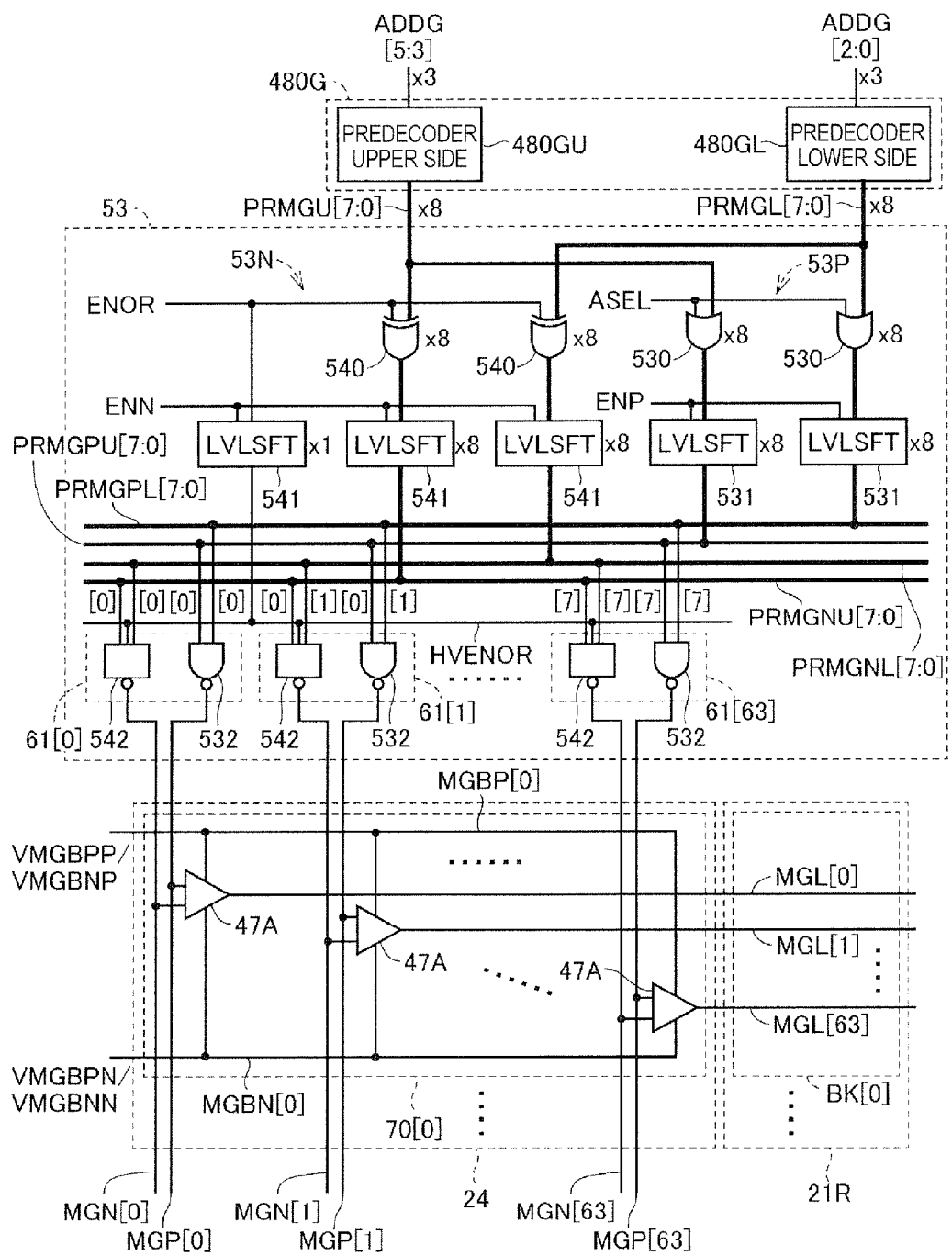
FIG. 6 is a block diagram illustrating the configuration of an MGP/MGN decoder of the MG decoder unit illustrated in FIG. 5.

FIG. 6 is a block diagram illustrating the configuration of the MGP/MGN decoder 53 of the MG decoder unit 25A illustrated in FIG. 5. FIG. 6 also illustrates the predecoder 480G (including a predecoder 480GU for the upper side address and a predecoder 480GL for the lower side address), the MG driver circuit 24, and the right memory mat 21R, illustrated in FIG. 5.

FIG. 6 illustrates the case where the number of the control signal line MGP, the number of the control signal line MGN, and the number of the memory gate line MGL for every block BK, illustrated in FIG. 5 are all 64 pieces (N=64). Therefore, a 6-bit address signal ADDG[5:0] is employed. The predecoder 480GU decodes an upper-order 3-bit address signal ADDG[5:3] to eight 1-bit predecode signals PRMGU[7:0]. The predecoder 480GL decodes a lower-order 3-bit address signal ADDG[2:0] to eight 1-bit predecode signals PRMGL[7:0].

As illustrated in FIG. 6, the MGP/MGN decoder 53 includes 16 OR gates 530 and 16 EXOR gates 540, as a low voltage logic circuit, 33 level shifters (LVLSFT) 531 and 541, and high voltage decoders 61[0]-61[63].

The configuration and operation of the MGP/MGN decoder 53 illustrated in FIG. 6 are similar to the configuration and operation of the MGPB/MGPN decoder illustrated in FIG. 5. Specifically, the OR gate 530, the EXOR gate 540, and the level shifters 531 and 541 illustrated in FIG. 6 correspond to the OR gate 510, the EXOR gate 520, and the level shifters 511 and 521 illustrated in FIG. 5, respectively. The high voltage decoders 61[0]-61[63] illustrated in FIG. 6 correspond to the high voltage decoders 60[0]-60[63] illustrated in FIG. 5, respectively.

Furthermore, the predecode signals PRMGL and PRMGU of the VDD level illustrated in FIG. 6 correspond to the predecode signals PRMGBL and PRMGBU of the VDD level illustrated in FIG. 5, respectively. The predecode signals PRMGPL, PRMGPU, PRMGNL, and PRMGNU of a high voltage level illustrated in FIG. 6 correspond to the predecode signals PRMGBPL, PRMGBPU, PRMGBNL, and PRMGBNU of a high voltage level illustrated in FIG. 5, respectively.

However, the voltage level of the output signal of the level shifters 531 and 541 differs from the case of FIG. 5 (a concrete numerical example will be explained in FIG. 8). Specifically, the level shifter 531 illustrated in FIG. 6 converts an input signal of a VDD level into a signal of a positive high voltage level (a high-side power supply potential VMGPP; a low-side power supply potential VMGPN). The level shifter 541 illustrated in FIG. 6 converts an input signal of a VDD level into a positive or negative high voltage level (a high-side power supply potential VMGNP; a low-side power supply potential VMGNN).

The high voltage decoder 61 illustrated in FIG. 6 differs from the high voltage decoder 60 illustrated in FIG. 5 in that the high voltage NAND circuit 532 and the high voltage logic circuit 542 (NAND/NOR circuit) are provided in place of the high voltage AND circuit 512 and the high voltage logic circuit 522 (AND/OR circuit). Specifically, the high voltage NAND circuit 532 provided in the (i+8×j)-th high voltage decoder 61[i+8×j] (0≤i≤7, 0≤j≤7) is supplied with the i-th predecode signal PRMGPL[i] of a high voltage level and the j-th predecode signal PRMGPU[j] of a high voltage level. The high voltage NAND circuit 532 performs the NAND operation of the supplied predecode signals PRMGPL[i] and PRMGPU[j]. The voltage signal (NAND operation result) generated by the high voltage NAND circuit 532 is supplied to the control signal line MGP[i+8×j] of the MG driver circuit 24.

The high voltage logic circuit 542 provided in the (i+8×j)-th high voltage decoder 61[i+8×j] (0≤i≤7, 0≤j≤7) is supplied with the i-th predecode signal PRMGNL[i] of a high voltage level, the j-th predecode signal PRMGNU[j] of a high voltage level, and a high voltage inversion control signal HVENOR. The high voltage logic circuit 542 performs the NAND operation of the supplied predecode signals PRMGNL[i] and PRMGNU[j], when the high voltage inversion control signal HVENOR is at an L level. The high voltage logic circuit 542 performs the NOR operation of the supplied predecode signals PRMGNL[i] and PRMGNU[j], when the high voltage inversion control signal HVENOR is at an H level. The voltage signal (NAND operation result or NOR operation result) generated by the high voltage logic circuit 542 is supplied to the control signal line MGN[i+8×j] of the MG driver circuit 24.

The other points of the MGP/MGN decoder 53 illustrated in FIG. 6 are almost the same as the MGBP/MGBN decoder 54 illustrated in FIG. 5. Therefore, the same symbol or reference numeral is attached to the same or corresponding element and the explanation thereof is not repeated.

Among the MGP/MGN decoders 53 illustrated in FIG. 6, the OR gate 530, the level shifter 531, and the high voltage NAND circuit 532 related to the output of the control signal to the control signal line MGP[63:0] of the MG driver circuit 24 are collectively called an MGP decoder 53P. Similarly, the EXOR gate 540, the level shifter 541, and the high voltage logic circuit 542 related to the output of the control signal to the control signal line MGN[63:0] of the MD driver circuit 24 are collectively called an MGN decoder 53N.

(An MGG Decoder)

When the MG driver 47B of the configuration illustrated in FIG. 4B is employed, the MGG decoder 53G is provided in place of the MGP/MGN decoder 53. N-piece control signal lines MGG[0]-MGG[N−1] are pulled out from the MGG decoder 53G. The s-th control signal line MGG[s] (0≤s≤N−1) is coupled to the MG driver 47B corresponding to the s-th memory gate line MGL[s] of each block BK. As explained in FIG. 4B, the control signal line MGG is coupled to each gate of the PMOS transistor 471 and the NMOS transistor 472 which configure the corresponding MG driver 47B of each MG driver group 70.

Figure 7:
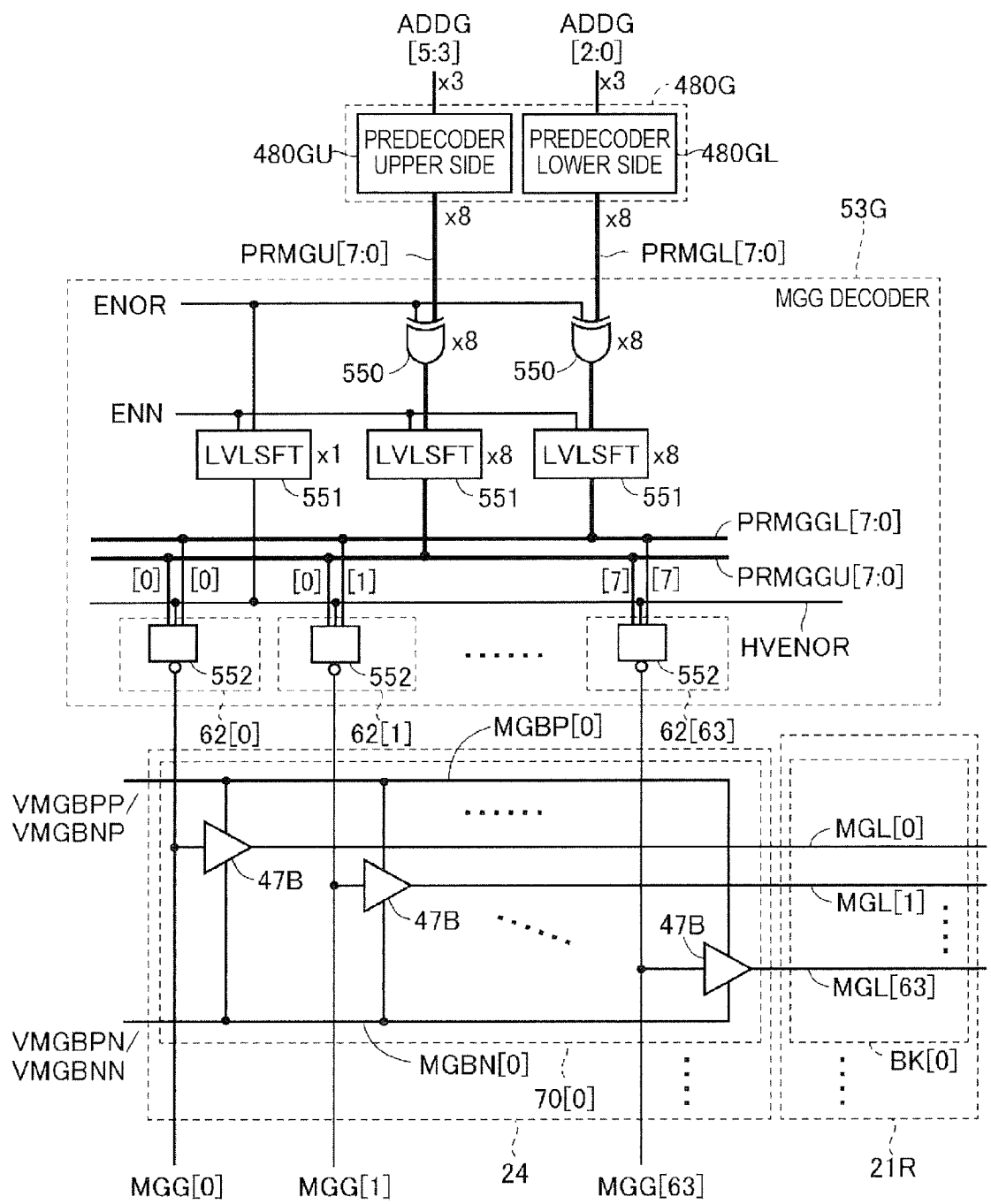
FIG. 7 is a block diagram illustrating an example of the circuit configuration of an MGG decoder.

FIG. 7 is a block diagram illustrating an example of the circuit configuration of the MGG decoder 53G. FIG. 7 also illustrates the predecoder 480G (including a predecoder 480GU for the upper side address and a predecoder 480GL for the lower side address), the MG driver circuit 24, and the right memory mat 21R, illustrated in FIG. 5.

FIG. 7 illustrates the case where the number of the control signal line MGG and the number of the memory gate line MGL for every block BK are 64 pieces (N=64). As is the case with FIG. 6, among the 6-bit address signal ADDG[5:0], the upper-order 3-bit address signal ADDG[5:3] is decoded to a predecode signal PRMGU[7:0] by the predecoder 480GU, and the lower-order 3-bit address signal ADDG[2:0] is decoded to a predecode signal PRMGL[7:0] by the predecoder 480GL.

As illustrated in FIG. 7, the MGG decoder 53G includes 16 EXOR gates 550 as a low voltage logic circuit, 17 level shifters 551, and high voltage decoders 62[0]-62[63]. The MGG decoder 53G illustrated in FIG. 7 has the same configuration as the MGN decoder 53N illustrated in FIG. 6. Specifically, the EXOR gate 550 and the level shifter 551 illustrated in FIG. 7 correspond to the EXOR gate 540 and the level shifter 541 illustrated in FIG. 6. The high voltage decoders 62[0]-62[63] illustrated in FIG. 7 correspond to the high voltage decoders 61[0]-61[63] illustrated in FIG. 6, respectively. The high voltage logic circuit 552 (NAND/NOR circuit) illustrated in FIG. 7 corresponds to the high voltage logic circuit 542 illustrated in FIG. 6. Furthermore, the predecode signals PRMGGU and PRMGGL of the high voltage level illustrated in FIG. 7 correspond to the predecode signals PRMGNU and PRMGNL of the high voltage level illustrated in FIG. 6, respectively.

However, the voltage level of the output signal of the level shifter 551 differs from the case of FIG. 5 (a concrete numerical example will be explained in FIG. 8). Specifically, the level shifter 551 illustrated in FIG. 7 converts an input signal of a VDD level into a positive or negative high voltage level (a high-side power supply potential VMGGP; a low-side power supply potential VMGGN).

Furthermore, the high voltage decoder 62 illustrated in FIG. 7 differs from the high voltage decoder 62 illustrated in FIG. 6 in that the high voltage decoder 62 illustrated in FIG. 7 is provided with only the high voltage logic circuit 552 (NAND/NOR circuit) and is not provided with a high voltage NAND circuit. Specifically, the (i+8×j)-th high voltage logic circuit 552 provided in the high voltage decoder 62[i+8×j] (0≤i≤7, 0≤j≤7) is supplied with the i-th predecode signal PRMGGL[i] of a high voltage level, the j-th predecode signal PRMGGU[j] of a high voltage level, and a high voltage inversion control signal HVENOR. The high voltage logic circuit 552 performs the NAND operation of the supplied predecode signals PRMGGL[i] and PRMGGU[j], when the high voltage inversion control signal HVENOR is at an L level. The high voltage logic circuit 552 performs the NOR operation of the supplied predecode signals PRMGGL[i] and PRMGGU[j], when the high voltage inversion control signal HVENOR is at an H level. The voltage signal (NAND operation result or NOR operation result) generated by the high voltage logic circuit 552 is supplied to the control signal line MGG[i+8×j] of the MG driver circuit 24.

The other points of the MGG decoder 53G illustrated in FIG. 7 is almost the same as the MGN decoder 53N illustrated in FIG. 6. Therefore, the same symbol or reference numeral is attached to the same or corresponding element and the explanation thereof is not repeated.

[An Example of the Power Supply Potential]

FIG. 8 is a drawing in a tabular form illustrating an example of the power supply potential supplied to a circuit of a high voltage system in the MG decoder unit 25A illustrated in FIG. 5. The power supply potential supplied to the circuit of the high voltage system differs depending on the operation mode (write, erasing, and read). These kinds of the power supply potential are generated by the step-up circuit illustrated in FIG. 3.

With reference to FIG. 5 and FIG. 8, the level shifter 511 and the high voltage AND circuit 512 of the MGBP decoder 54P are supplied with the high-side power supply potential VMGBPP and the low-side power supply potential VMGBPN. The high-side power supply potential VMGBPP is set at a positive high voltage of 6.4 to 11V in the write mode. The level shifter 521 and the high voltage logic circuit 522 of the MGBN decoder 54N are supplied with the high-side power supply potential VMGBNP and the low-side power supply potential VMGBNN. The low-side power supply potential VMGBNN is set at a negative high voltage of −3.3 to −8.0V in the erasing mode.

With reference to FIG. 6 and FIG. 8, the level shifter 531 and the high voltage AND circuit 532 of the MGP decoder 53P are supplied with the high-side power supply potential VMGPP and the low-side power supply potential VMGPN. The high-side power supply potential VMGPP is set at a positive high voltage of 6.4 to 11V in the write mode. The level shifter 541 and the high voltage logic circuit 542 of the MGN decoder 53N are supplied with the high-side power supply potential VMGNP and the low-side power supply potential VMGNN. The low-side power supply potential VMGNN is set at a negative high voltage of −3.3 to −8.0V in the erasing mode.

With reference to FIG. 7 and FIG. 8, the level shifter 551 and the high voltage logic circuit 552 of the MGG decoder 53G are supplied with the high-side power supply potential VMGGP and the low-side power supply potential VMGGN. The high-side power supply potential VMGGP is set at a positive high voltage of 6.4 to 11V in the write mode. The low-side power supply potential VMGGN is set at a negative high voltage of −3.3 to −8.0V in the erasing mode.

[An Example of the Configuration of the Level Shifter 511]

Figure 9:
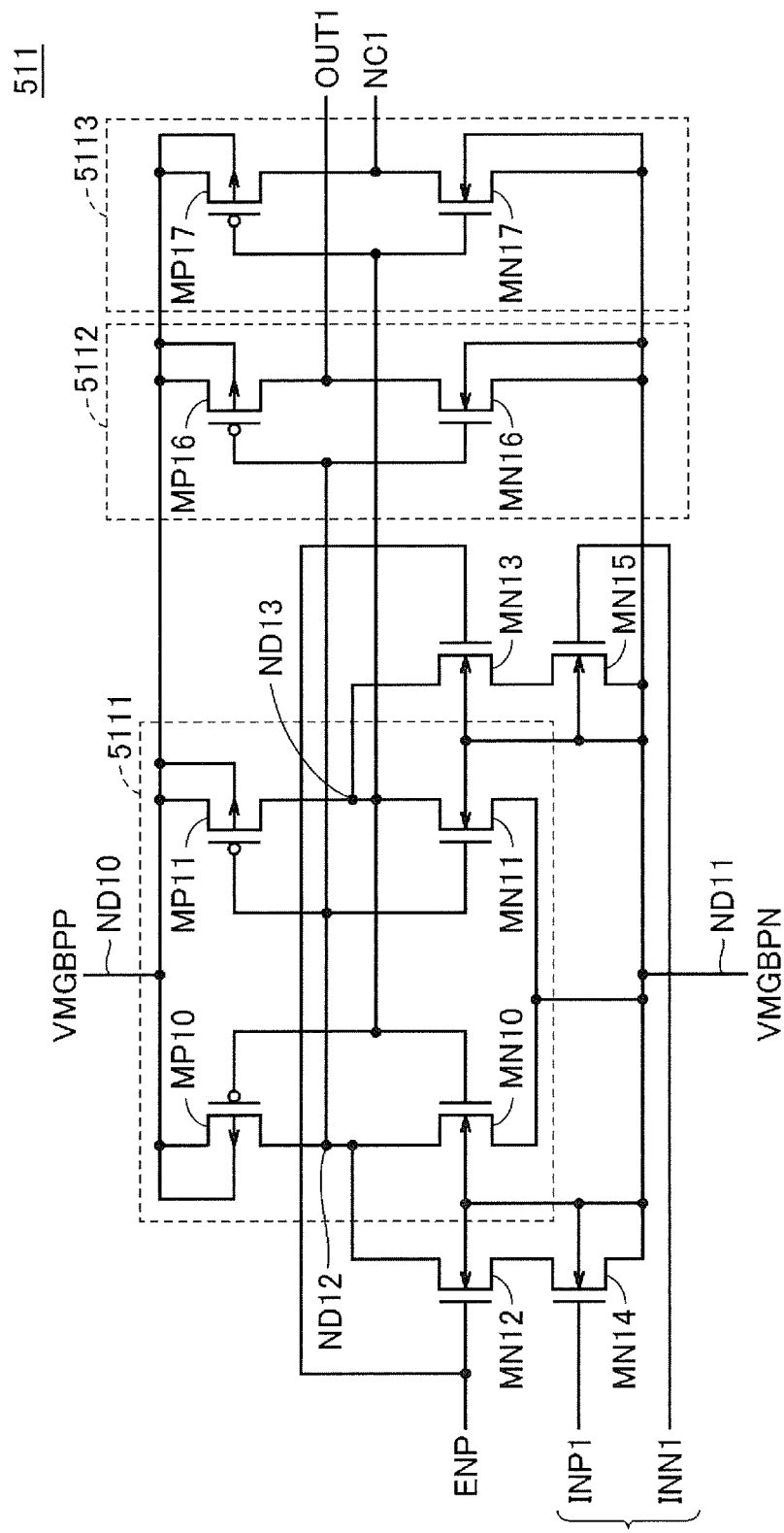
FIG. 9 is a circuit diagram illustrating an example of the configuration of a level shifter illustrated in FIG. 5.

FIG. 9 is a circuit diagram illustrating an example of the configuration of the level shifter 511 illustrated in FIG. 5. With reference to FIG. 9, the level shifter 511 includes a CMOS (Complementary MOS) latch circuit 5111, NMOS transistors MN12-MN15, and CMOS inverters 5112 and 5113 as an output buffer.

The CMOS latch circuit 5111 is coupled between a high-side power supply node ND10 to which the high power supply potential VMGBPP is supplied, and a low-side power supply node ND11 to which the high power supply potential VMGBPN is supplied. The CMOS latch circuit 5111 includes a CMOS inverter configured with a PMOS transistor MP10 and an NMOS transistor MN10, and a CMOS inverter configured with a PMOS transistor MP11 and an NMOS transistor MN11. The CMOS latch circuit 5111 has the configuration in which each output of these CMOS inverters is coupled to the input of the CMOS inverter on the other side. Complementary data is held at a coupling node ND12 of the transistors MP10 and MN10, and a coupling node ND13 of the transistors MP11 and MN11.

The NMOS transistor MN14 is coupled between the power supply node ND11 and the coupling node ND12 via NMOS transistor MN12, and the NMOS transistor MN15 is coupled between the power supply node ND11 and the coupling node ND12 via NMOS transistor MN13. Complementary input signals INP1 and INN1 are inputted to the gates of the transistors MN14 and MN15. As explained specifically in FIG. 5, the low voltage predecode signal PRMGBL and the signal of the inverted logical level thereof or the low voltage predecode signal PRMGBU and the signal of the inverted logical level thereof are inputted as the input signals INP1 and INN1. The signals obtained by inverting the logical level of the input signals INP1 and INN1 are held at the coupling nodes ND12 and ND13.

The NMOS transistor MN12 is coupled between the NMOS transistor MN14 and the coupling node ND12, and the NMOS transistor MN13 is coupled between the NMOS transistor MN15 and the coupling node ND13. A common cutoff signal ENP is inputted to the gates of the transistors MN12 and MN13. When the cutoff signal ENP changes from an H level to an L level, the input of the input signals INP1 and INN1 to the coupling node ND12 and ND13 is cut off.

The CMOS inverter 5112 includes a PMOS transistor MP16 and an NMOS transistor MN16 which are coupled in series between the power supply nodes ND10 and ND11. The CMOS inverter 5112 inverts the logical level of the signal held at the coupling node ND12, and outputs it as an output signal OUT1.

The CMOS inverter 5113 includes a PMOS transistor MP17 and an NMOS transistor MN17 which are coupled in series between the power supply node ND10 and ND11. The CMOS inverter 5113 inverts the logical level of the signal held at the coupling node ND13. In the circuit illustrated in FIG. 5, an output node NC1 of the CMOS inverter 5113 is open; however, in order to equalize the load of the coupling nodes ND12 and ND13, the CMOS inverter 5113 is provided.

Next, the operation of the level shifter 511 is explained. The complementary input signals INP1 and INN1 of a VDD level are inputted in the state where the absolute value of the voltage applied to the power supply nodes ND10 and ND11 are at a low level (VDD level). By setting the cutoff signal ENP at an H level at this moment, the signals of the inverted logical level of the input signals INP1 and INN1 are inputted to the CMOS latch circuit 5111, and are held at the coupling nodes ND12 and ND13.

Subsequently, the state where the input signals INP1 and INN1 are latched at the CMOS latch circuit 5111 is realized by changing the cutoff signal ENP to an L level. In this state, the potential applied to the power supply nodes ND10 and ND11 is change to a desired value (VMGBPP, VMGBPN). For example, in writing, the potential of the power supply node ND10 is raised to the power supply potential VMGBPP necessary for the write. The potential of the low-side power supply node ND11 may be supplied with the power supply potential VMGBPN from the beginning, or may be raised in accordance with the rise of the applied voltage of the high-side power supply node ND10. As a result, when the input signal INP1 is at an H level, the high-side power supply potential VMGBPP is outputted as the output signal OUT1, and when the input signal INP1 is at an L level, the low-side power supply potential VMGBPN is outputted as the output signal OUT1.

The level shifter 521 of FIG. 5 corresponds to the circuit illustrated in FIG. 9 in which the power supply potentials VMGBNP and VMGBNN are inputted to the power supply nodes ND10 and ND11, respectively, and the cutoff signal ENN is inputted to the gates of the NMOS transistors MN12 and MN13. The input signal INP1 and INN1 correspond to the predecode signal PRMGBL and the signal of the inverted logical level thereof, or the predecode signal PRMGBU and the signal of the inverted logical level thereof, or the inversion control signal ENOR and the signal of the inverted logical level thereof. When the inversion control signal ENOR is at an H level, the input signals of the former two are inputted after the logical level is inverted.

The level shifter 531 illustrated in FIG. 6 corresponds to the circuit illustrated in FIG. 9 in which the power supply potentials VMGPP and VMGPN are inputted to the power supply nodes ND10 and ND11, respectively. Furthermore, the input signals INP1 and INN1 correspond to the predecode signal PRMGU and the signal of the inverted logical level thereof, or the predecode signal PRMGL and the signal of the inverted logical level thereof.

The level shifter 541 illustrated in FIG. 6 corresponds to the circuit illustrated in FIG. 9 in which the power supply potentials VMGNP and VMGNN are inputted to the power supply nodes ND10 and ND11, respectively, and the cutoff signal ENN is inputted to the gates of the NMOS transistors MN12 and MN13. Furthermore, the input signals INP1 and INN1 correspond to the predecode signal PRMGU and the signal of the inverted logical level thereof, or the predecode signal PRMGL and the signal of the inverted logical level thereof, or the inversion control signal ENOR and the signal of the inverted logical level thereof. When the inversion control signal ENOR is at an H level, the input signals of the former two are inputted after the logical level is inverted.

The level shifter 551 illustrated in FIG. 7 corresponds to the circuit illustrated in FIG. 9 in which the power supply potentials VMGGP and VMGGN are inputted to the power supply nodes ND10 and ND11, respectively, and the cutoff signal ENN is inputted to the gates of the NMOS transistors MN12 and MN13. The input signals INP1 and INN1 are the same as the case of the level shifter 541 illustrated in FIG. 6.

[An Example of the Configuration of the High Voltage AND Circuit 512]

Figure 10:
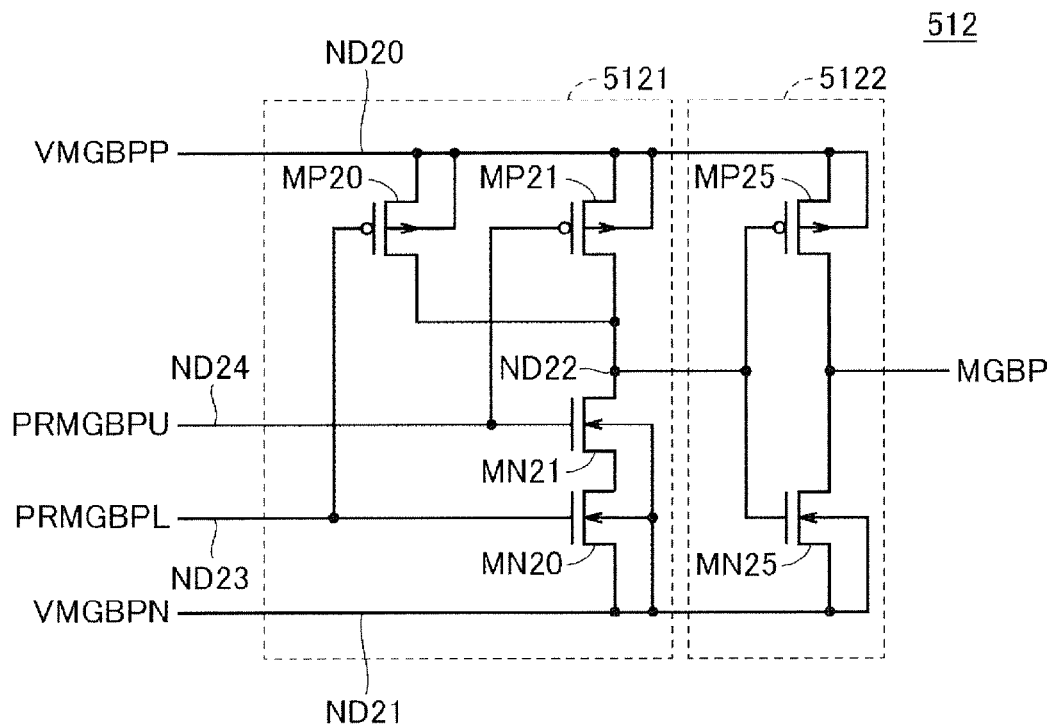
FIG. 10 is a circuit diagram illustrating an example of the configuration of a high voltage AND circuit illustrated in FIG. 5.

FIG. 10 is a circuit diagram illustrating an example of the configuration of the high voltage AND circuit 512 illustrated in FIG. 5. The high voltage AND circuit 512 has the same configuration as the AND circuit in the case of the power supply potential VDD of the low voltage system except for the following points. The first difference is that the power supply potential VMGBPP is applied to a high-side power supply node ND20, and the power supply potential VMGBPN is applied to a low-side power supply node ND21. The second difference is that the high voltage AND circuit 512 is configured with a high withstand voltage CMOS device. Specifically, the high voltage AND circuit 512 includes an NAND circuit 5121 and an inverter 5122.

The NAND circuit 5121 includes PMOS transistors MP20 and MP21 which are mutually coupled in parallel between the high-side power supply node ND20 and an intermediate node ND22, and NMOS transistors MN21 and MN20 which are mutually coupled in series between the intermediate node ND22 and the low-side power supply node ND21. The gates of the transistor MP20 and MN20 are coupled to a first input node ND23, and the gates of the transistor MP21 and MN21 are coupled to a second input node ND24. In the example illustrated in FIG. 5, the high voltage predecode signals PRMGBPL and PRMGBPU outputted from two corresponding level shifters 511 are inputted to the input nodes ND23 and ND24, respectively.

The inverter 5122 includes a PMOS transistor MP25 and an NMOS transistor MN25 which are mutually coupled in series between the power supply nodes ND20 and ND21. The inverter 5122 outputs the signal obtained by inverting the logical level of the voltage signal at the intermediate node ND22, to the high-side power supply line MGBP of the corresponding MG driver group 70 explained in FIG. 5.

The high voltage NAND circuit 532 illustrated in FIG. 6 corresponds to the circuit illustrated in FIG. 10 in which the power supply potentials VMGPP and VMGPN are inputted to the power supply nodes ND20 and ND21, respectively, and the predecode signals PRMGPL and PRMGPU are inputted to the input nodes ND23 and ND24, respectively. Furthermore, the high voltage NAND circuit 532 illustrated in FIG. 6 is not provide with the inverter 5122 or provided with two stages of the inverters 5122 coupled in series. In this case, the intermediate node ND22 of the NAND circuit 5122 or the output node of the latter inverter 5122 is coupled to the corresponding control signal line MGP.

[An Example of the Configuration of the EXOR Gate 520]

Figure 11:
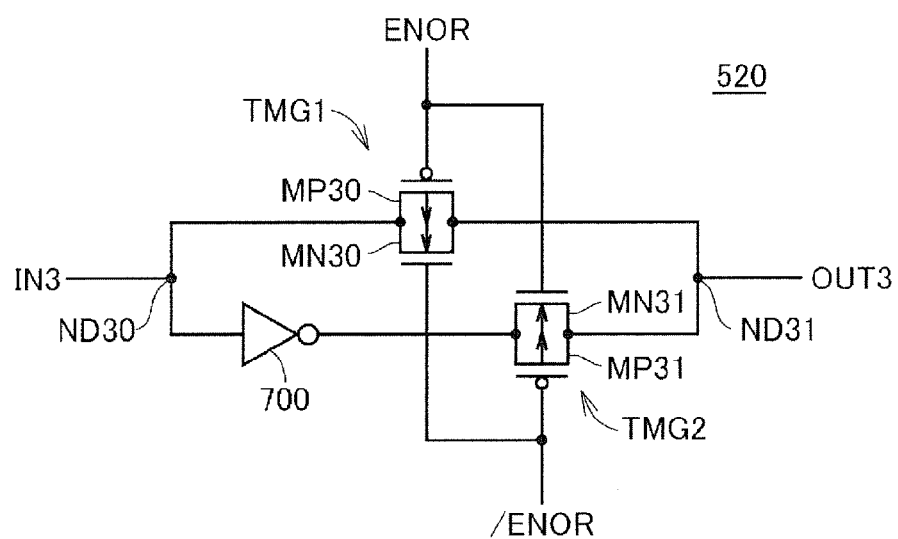
FIG. 11 is a circuit diagram illustrating an example of the configuration of an EXOR gate illustrated in FIG. 5.

FIG. 11 is a circuit diagram illustrating an example of the configuration of the EXOR gate 520 illustrated in FIG. 5. With reference to FIG. 11, the EXOR gate 520 includes an inverter 700, a transmission gate TMG1 configured with a PMOS transistor MP30 and an NMOS transistor MN30, and a transmission gate TMG2 configured with a PMOS transistor MP31 and an NMOS transistor MN31. Between an input node ND30 and an output node ND31, a first path passing the transmission gate TMG1 and a second path passing the inverter 700 and the transmission gate TMG2 are provided.

In the above-described configuration, the inversion control signal ENOR is inputted to the gates of the transistors MP30 and MN31, and a control signal /ENOR obtained by inverting the logical level of the inversion control signal ENOR is inputted to the gates of the transistors MP31 and MN30. Accordingly, when the inversion control signal ENOR is at an H level, the transmission gate TMG1 is set to an OFF state and the transmission gate TMG2 is set to an ON state. When the inversion control signal ENOR is at an L level, the transmission gate TMG1 is set to an ON state and the transmission gate TMG2 is set to an OFF state. As a result, when the inversion control signal ENOR is at an H level, the logical level of an output signal OUT3 becomes the inverted logical level of the input signal IN3, and when the inversion control signal ENOR is at an L level, the logical level of the output signal OUT3 becomes same as the logical level of the input signal IN3.

The configuration of the EXOR gates 540 and 550 illustrated in FIG. 6 and FIG. 7 is the same as the circuit configuration illustrated in FIG. 11.

[An Example of the Configuration of the High Voltage Logic Circuit 522]

Figure 12:
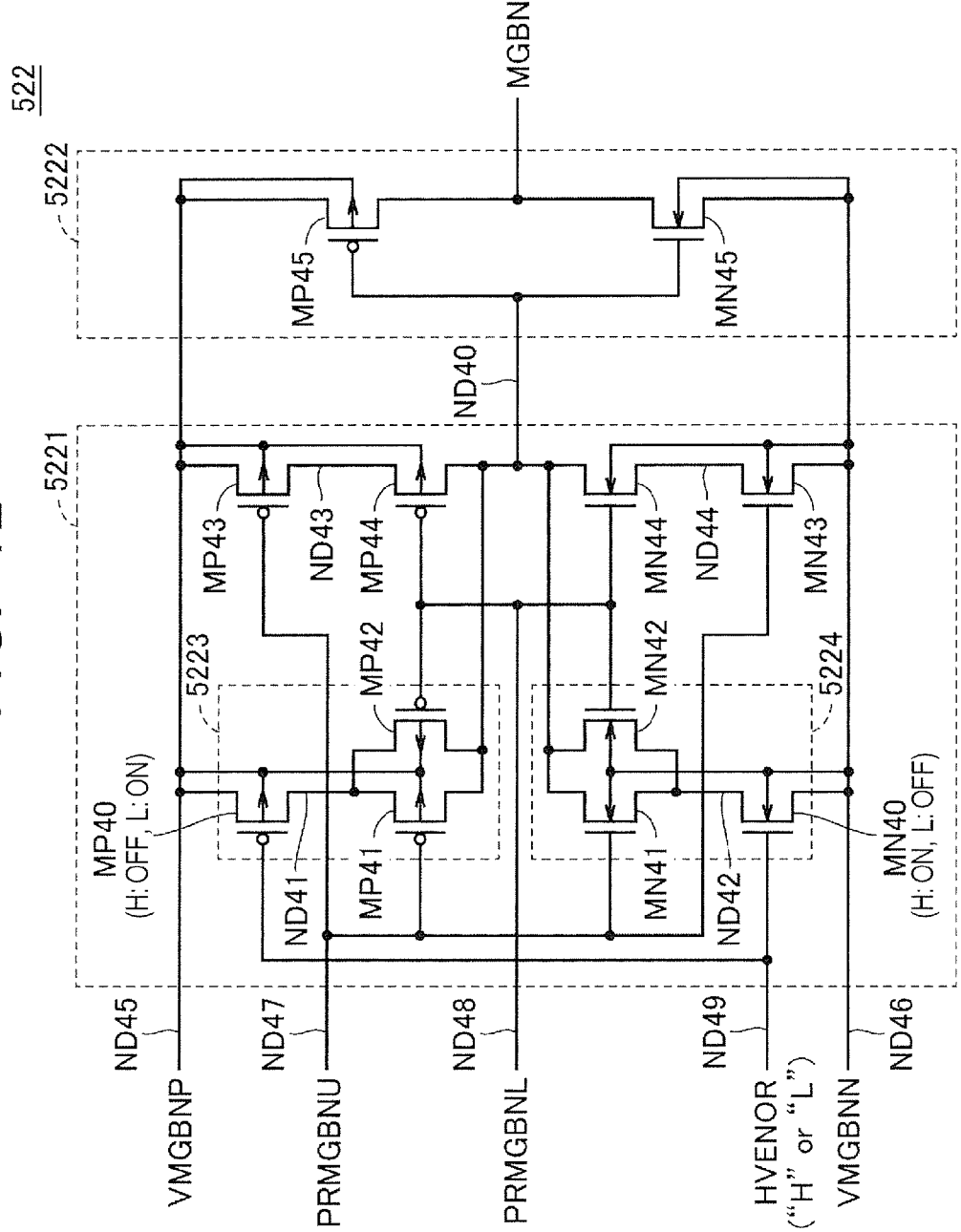
FIG. 12 is a circuit diagram illustrating an example of the configuration of a high voltage logic circuit illustrated in FIG. 5.

FIG. 12 is a circuit diagram illustrating an example of the configuration of the high voltage logic circuit 522 illustrated in FIG. 5. The high voltage logic circuit 522 is configured with a high withstand voltage CMOS device, and operates with the supply of the high power supply potential VMGBNP supplied to a high-side power supply node ND45 and the high power supply potential VMGBNN supplied to a low-side power supply node ND46.

The high voltage logic circuit 522 is provided with three input nodes ND47, ND48, and ND49. The high voltage predecode signals PRMGBNU and PRMGBNL outputted from two corresponding level shifters 521 are inputted to the input nodes ND47 and ND48, respectively. The high voltage inversion control signal HVENOR outputted from the corresponding level shifter 521 is inputted to the input node ND49. An output node of the high voltage logic circuit 522 is coupled to the corresponding low-side power supply line MGBN of the MG driver circuit 24.

Specifically, the high voltage logic circuit 522 includes an NAND/NOR circuit 5221 and a CMOS inverter 5222. The NAND/NOR circuit 5221 includes PMOS transistors MP40-MP44 and NMOS transistors MN40-MN44. The transistors MP40 and MP41 are coupled in series in this order between the high-side power supply node ND45 and an intermediate node ND40. The transistor MP42 is coupled in parallel with the transistor MP41. The transistors MP43 and MP44 are coupled in series in this order between the high-side power supply node ND45 and the intermediate node ND40, and coupled in parallel with the whole of the transistors MP40 and MP41. Similarly, the transistors MN40 and MN41 are coupled in series in this order between the low-side power supply node ND46 and the intermediate node ND40. The transistor MN42 is coupled in parallel with the transistor MN41. The transistors MN43 and MN44 are coupled in series in this order between the low-side power supply node ND46 and the intermediate node ND40, and coupled in parallel with the whole of the transistors MN40 and MN41.

The input node ND47 is coupled to the gates of the transistors MP41, MP43, MN41, and MN43. The input node ND48 is coupled to the gates of the transistors MP42, MP44, MN42, and MN44. The input node ND49 is coupled to the gates of the transistors MP40 and MN40.

The CMOS inverter 5222 includes a PMOS transistor MP45 and an NMOS transistor MN45 which are coupled in series between the high-side power supply node ND45 and the low-side power supply node ND46. The CMOS inverter 5222 outputs a signal obtained by inverting the logical level of the voltage signal at the intermediate node ND40, to the corresponding low-side power supply line MGBN of the MG driver circuit 24.

Next, the operation of the high voltage logic circuit 522 is explained. First, the case where the high voltage inversion control signal HVENOR is at an L level is explained. In this case, the PMOS transistor MP40 is set to ON and the NMOS transistor MN40 is set to OFF. Therefore, the circuit part 5224 configured with the NMOS transistors MN40, MN41, and MN42 stops functioning. On the other hand, the other part of the NAND/NOR circuit 5221 functions. Accordingly, the NAND/NOR circuit 5221 operates as an NAND circuit which outputs the NAND operation result of the high voltage predecode signals PRMGBNU and PRMGBNL, and the whole high voltage logic circuit 522 operates as an AND circuit.

When the high voltage inversion control signal HVENOR is at an H level, the PMOS transistor MP40 is set to OFF and the NMOS transistor MN40 is set to ON. Therefore, the circuit part 5223 configured with the PMOS transistors MP40, MP41, and MP42 stops functioning. On the other hand, the other part of the NAND/NOR circuit 5221 functions. Accordingly, the NAND/NOR circuit 5221 operates as an NOR circuit which outputs the NOR operation result of the high voltage predecode signals PRMGBNU and PRMGBNL, and the whole high voltage logic circuit 522 operates as an OR circuit.

As described above, depending on whether the logical level of the high voltage inversion control signal HVENOR is at an L level or an H level, the high voltage logic circuit 522 can switch its function so as to operate as the AND circuit which outputs the AND logic of the high voltage predecode signals PRMGBNU and PRMGBNL, or so as to operate as the OR circuit which outputs the OR logic.

The high voltage logic circuit 542 illustrated in FIG. 6 corresponds to the circuit illustrated in FIG. 12 in which the power supply potentials VMGNP and VMGNN are inputted to the power supply nodes ND45 and ND46, respectively, and the predecode signals PRMGNU and PRMGNL are inputted to the input nodes ND47 and ND48, respectively. Furthermore, the high voltage NAND circuit 542 illustrated in FIG. 6 is not provide with the inverter 5222 or provided with two stages of the inverters 5222 coupled in series. In this case, the intermediate node ND40 of the NAND/NOR circuit 5221 or the output node of the latter inverter 5222 is coupled to the corresponding control signal line MGN.

The high voltage logic circuit 552 illustrated in FIG. 7 corresponds to the circuit illustrated in FIG. 12 in which the power supply potentials VMGGP and VMGGN are inputted to the power supply nodes ND45 and ND46, respectively, and the predecode signals PRMGGU and PRMGGL are inputted to the input nodes ND47 and ND48, respectively. Furthermore, the high voltage NAND circuit 552 illustrated in FIG. 7 is not provide with the inverter 5222 or provided with two stages of the inverters 5222 coupled in series. In this case, the intermediate node ND40 of the NAND/NOR circuit 5221 or the output node of the latter inverter 5222 is coupled to the corresponding control signal line MGG.

[Operation of the MG Decoder Unit - - - Writing]

Next, the operation of the MG decoder unit 25A illustrated in FIG. 5 is explained. First, the operation in data write to the memory cell MC is explained.

(Outline of Operation)

Figure 13:
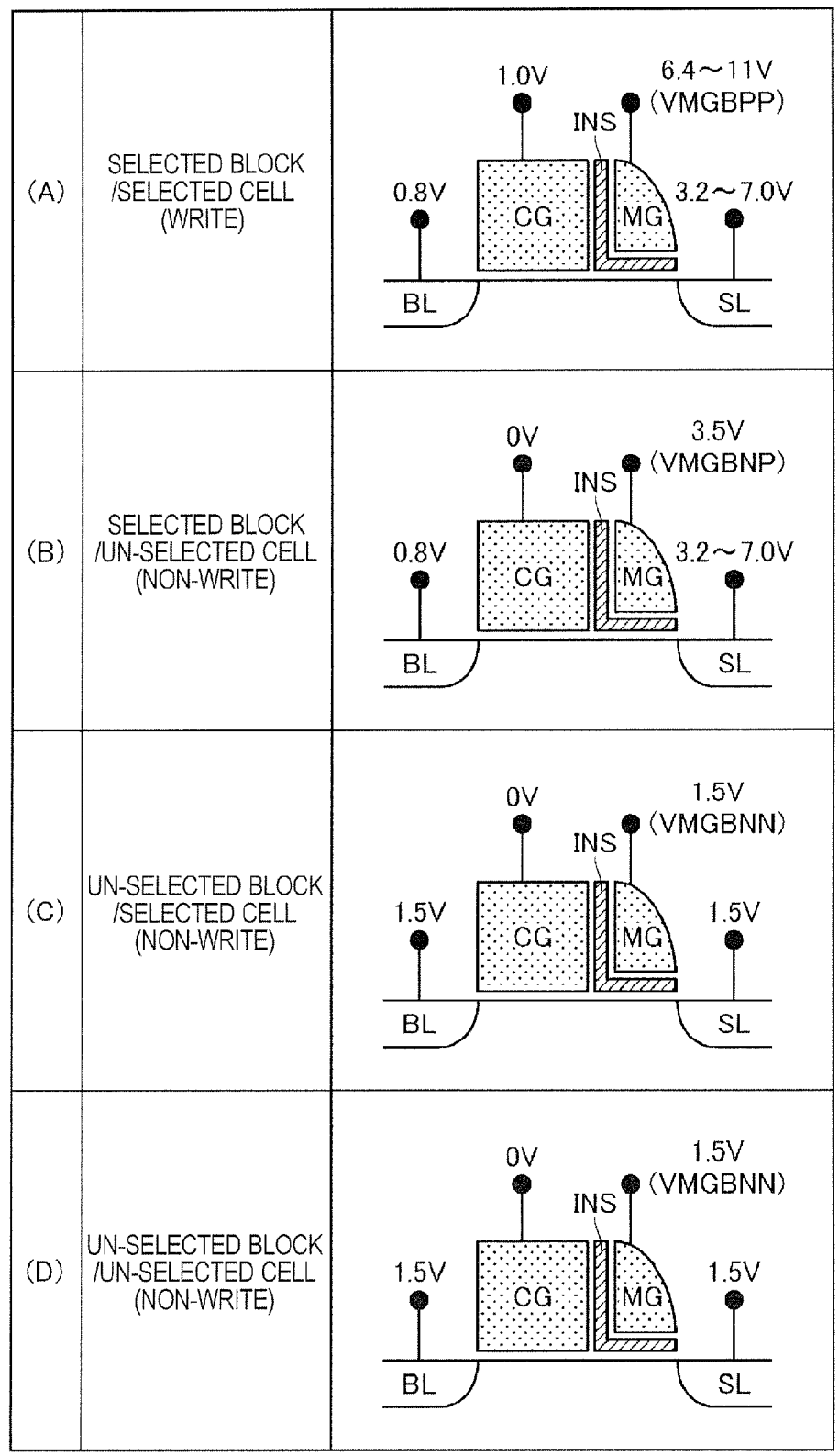
FIG. 13 is a schematic drawing illustrating a bias state of a selected/un-selected memory cell in writing.

FIG. 13 is a schematic drawing illustrating a bias state of a selected/un-selected memory cell in writing. With reference to FIG. 5 and FIG. 13, selection of a block BK by the MGBP/MGBN decoder 54 is explained first. The predecoders 480L and 480U both output a signal of an H level ("1") as the predecode signals PRMGBL and PRMGBU corresponding to the selected block BK. Since the inversion control signal ENOR in writing is at an L level, the logical level of these predecode signals PRMGBL and PRMGBU is not inverted by the EXOR gate 520. Furthermore, the high voltage logic circuit 522 operates as an AND circuit in writing.

Accordingly, in the MG driver circuit 24, the high-side power supply potential VMGBPP (for example, 6.4 to 11V as illustrated in FIG. 8) of the high voltage AND circuit 512 is applied to the high-side power supply line MGBP corresponding to the selected block BK. In the MG driver circuit 24, the high-side power supply potential VMGBNP (for example, 3.5V as illustrated in FIG. 8) of the high voltage logic circuit 522 is applied to the low-side power supply line MGBN corresponding to the selected block BK.

On the other hand, at least one of the predecode signals PRMGBL and PRMGBU corresponding to the un-selected block BK becomes an L level ("0"). Accordingly, in the MG driver circuit 24, the low-side power supply potential VMGBPN (for example, 3.5V as illustrated in FIG. 8) applied to the high voltage AND circuit 512 is supplied to the high-side power supply line MGBP corresponding to the un-selected block BK. In the MG driver circuit 24, the low-side power supply potential VMGBNN (for example, 1.5V as illustrated in FIG. 8) applied to the high voltage logic circuit 522 is supplied to the low-side power supply line MGBN corresponding to the un-selected block BK.

Next, selection of the memory gate line MGL of each block BK is explained. In the following, for the sake of simplicity, it is assumed that the MGG decoder 53G illustrated in FIG. 7 is provided in place of the MGP/MGN decoder 53, and that the control signal line MGG is provided in place of the control signal lines MGP and MGN. The predecode signals PRMGL and PRMGU corresponding to the selected memory gate line MGL (selected cell) is at an H level, and the high voltage logic circuit 552 illustrated in FIG. 7 operates as an NAND circuit in writing. Accordingly, a signal at an L level, that is, the low-side power supply potential VMGGN (for example, 3.5V as illustrated in FIG. 8) of the high voltage logic circuit 522 illustrated in FIG. 7, is supplied to the control signal line MGG corresponding to the selected cell.

On the other hand, at least one of the predecode signals PRMGL and PRMGU corresponding to the un-selected memory gate line MGL (un-selected cell) is at an L level, and the high voltage logic circuit 552 illustrated in FIG. 7 operates as an NAND circuit in writing. Accordingly, a signal at an H level, that is, the high-side power supply potential VMGGP (for example, 6.4 to 11V as illustrated in FIG. 8) of the high voltage logic circuit 522 illustrated in FIG. 7, is supplied to the control signal line MGG corresponding to the un-selected cell.

According to the above, (A) the potential VMGBPP (for example, 6.4 to 11V) of the high-side power supply line MGBP is applied to the selected memory gate line in the selected block BK (that is, the memory gate MG of the memory cell of the write target); and (B) the potential VMGBNP (for example, 3.5V) of the low-side power supply line MGBN is applied to the un-selected memory gate line in the selected block BK.

On the other hand, the potential VMGBPN (for example, 3.5V) of the high-side power supply line MGBP corresponding to the un-selected block BK and the potential VMGBNN (for example, 1.5V) of the low-side power supply line MGBN are below the L-level potential VMGGN (for example, 3.5V) supplied by the control signal line MGG (that is, always at an H level). Therefore, (C) (D) irrespective of the selection (L level)/non selection (H level) of the memory gate line MGL, the potential VMGBNN (for example, 1.5V) of the low-side power supply line MGBN is applied to the memory gate line of the un-selected block BK.

(A Concrete Example of Operation)

Figure 14:
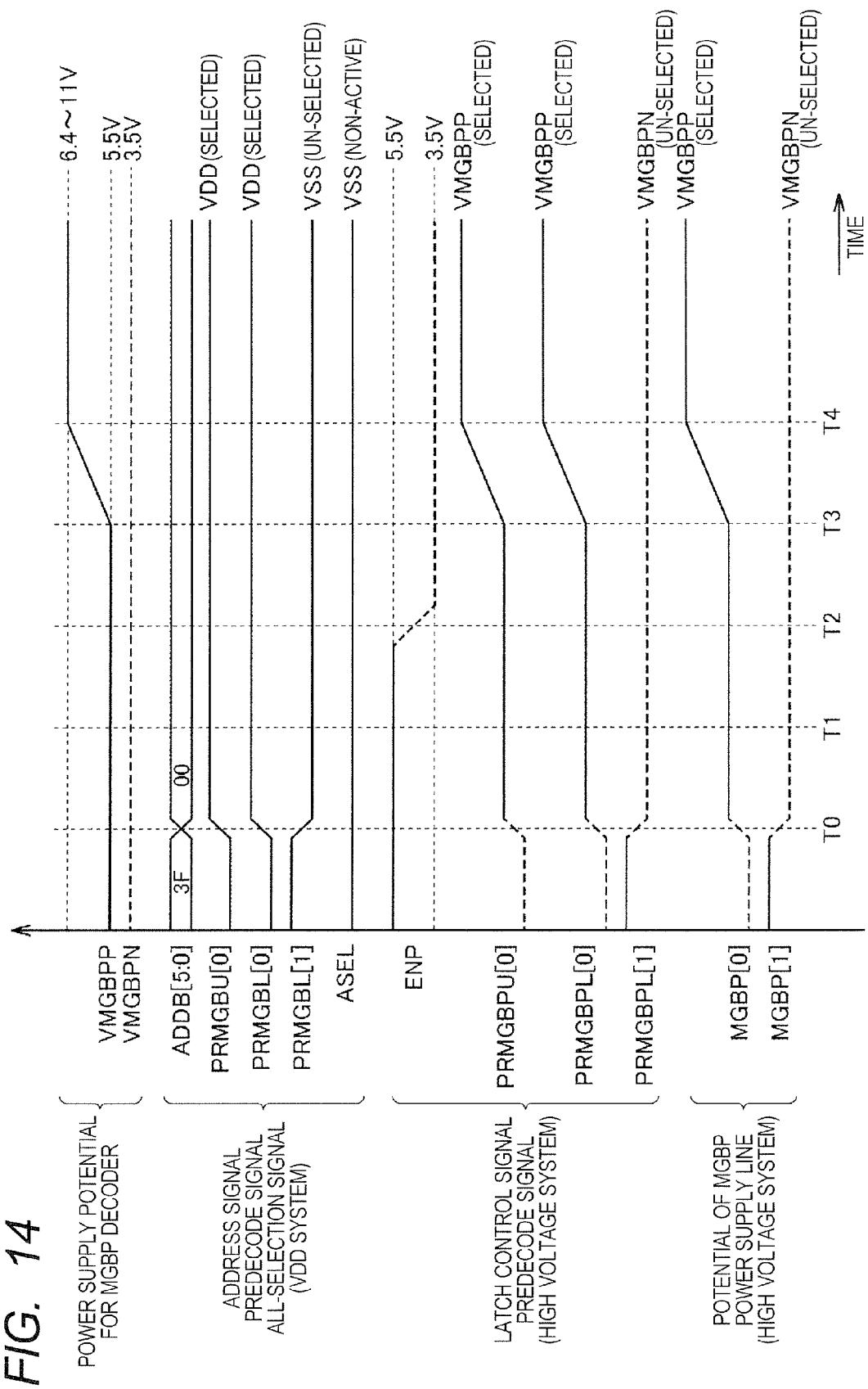
FIG. 14 is a timing chart of signals related to the MGBP decoder illustrated in FIG. 5 in writing.
Figure 15:
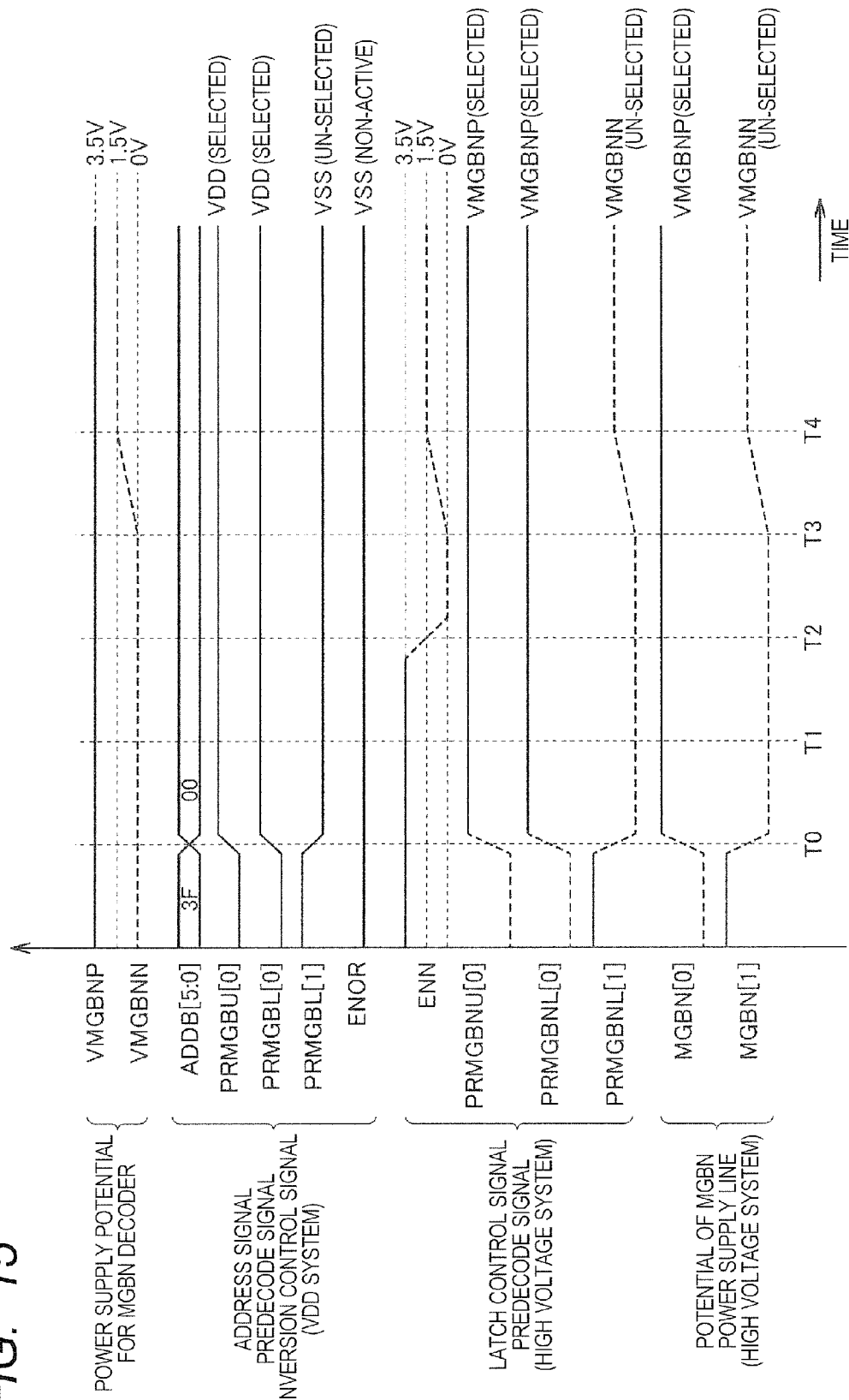
FIG. 15 is a timing chart of signals related to the MGBN driver illustrated in FIG. 5 in writing.
Figure 16:
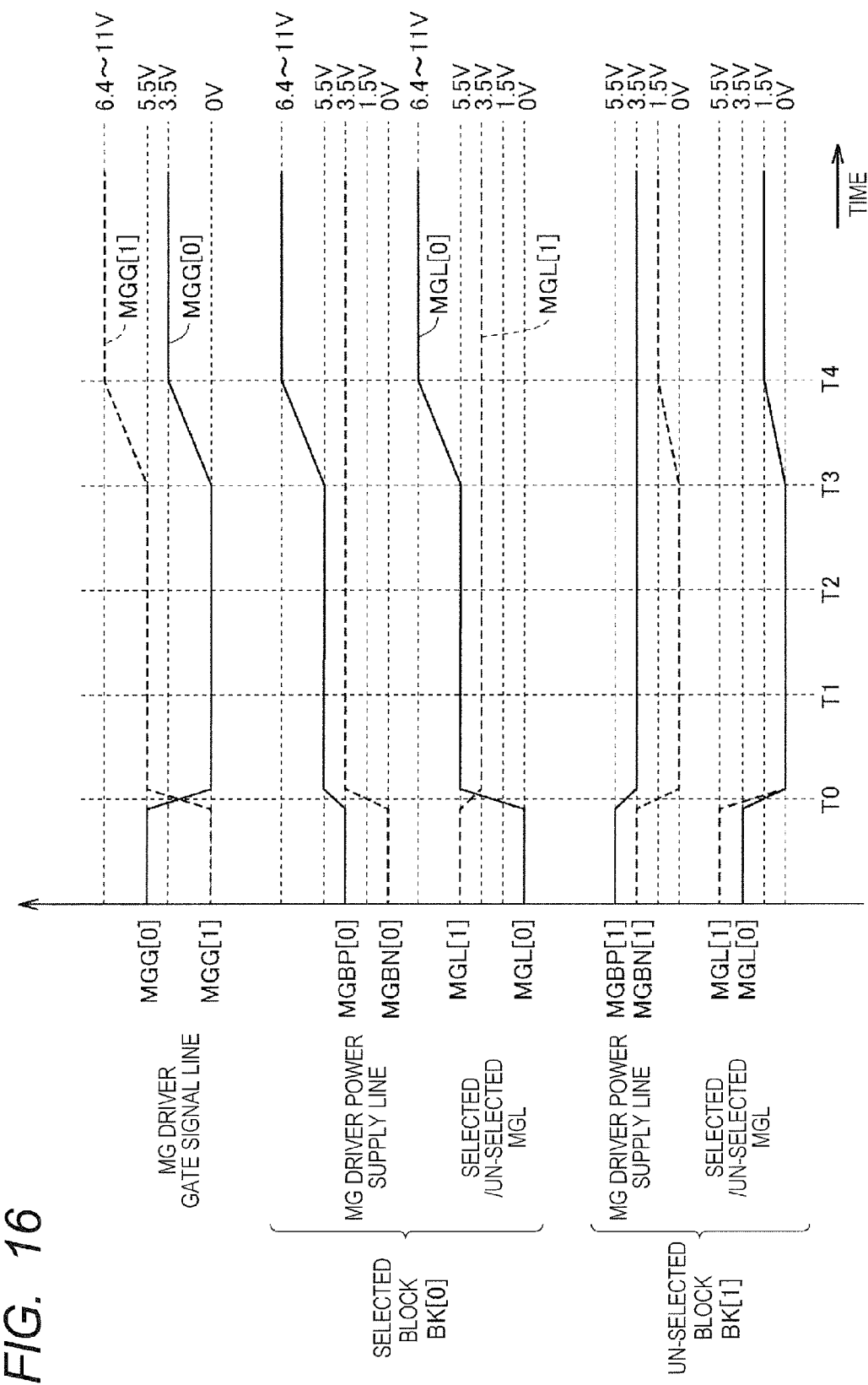
FIG. 16 is a timing chart of signals related to the MGG decoder illustrated in FIG. 7 in writing.

Hereinafter, with reference to FIG. 5 and FIG. 14 through FIG. 16, an concrete example of the operating sequence of the MG decoder unit 25A in writing is explained. In FIG. 14 through FIG. 16, it is assumed that the input address ADDB[5:0] to the MGBP/MGBN decoder 54 changes to 00H at time T0.

FIG. 14 is a timing chart of signals related to the MGBP decoder 54P illustrated in FIG. 5 in writing. With reference to FIG. 5 and FIG. 14, at time T0, the input address ADDB[5:0] changes to 00H, and the predecoder 480L on the lower address side selects a predecode signal PRMGBL[0], and the predecoder 480U on the upper address side selects a predecode signal PRMGBU[0]. The other predecode signals PRMGBL[7:1] and PRMGBU[7:1] are not selected. In writing, the all-selection signal ASEL is non-active.

At this time T0, the high-side power supply potential VMGBPP currently supplied to the level shifter 511 and the high voltage AND circuit 512 is 5.5V, and the low-side power supply potential VMGBPN is 3.5V. Accordingly, the voltage of the high voltage predecode signals PRMGBPU[0] and PRMGBPL[0] after the level conversion is about 5.5V, and the voltage of the other high voltage predecode signals PRMGBPU[7:1] and PRMGBPL[7:1] is about 3.5V.

At this time T0, the cutoff signal ENP currently supplied to the level shifter 511 is about 5.5V (H level). Accordingly, the built-in CMOS latch circuit 5111 is not latched, but the output signal of the level shifter 511 changes depending on the selection/non-selection of the predecode signals PRMGBL and PRMGBU.

The AND operation of the high voltage predecode signals PRMGBPU and PRMGBPL is performed by the high voltage AND circuit 512, and the voltage according to the calculation result is supplied to the high-side power supply line MGBP[63:0]. Accordingly, only the voltage of the high-side power supply line MGBP[0] coupled to the high voltage AND circuit 512 to which the high voltage predecode signals PRMGBPU[0] and PRMGBPL[0] are inputted become about 5.5V (VMGBPP), and the voltage of the other high-side power supply lines MGBP[63:1] becomes about 3.5V (VMGBPN).

Next, at time T2, the cutoff signal ENP changes from an H level (about 5.5V) to an L level (about 3.5V). Accordingly, the input signal to the level shifter 511 is cut off, and the state in which data is latched to the built-in CMOS latch circuit 5111 is realized.

Subsequently, from time T3 to time T4, the high-side power supply potential VMGBPP supplied to the level shifter 511 and the high voltage AND circuit 512 rises from about 5.5V to about 6.4-to-11V which is the memory gate voltage to enable writing. The low-side power supply potential VMGBPN remains at about 3.5V. With this change of the power supply potential, the selected high voltage predecode signals PRMGBPU[0] and PRMGBPL[0] rise from about 5.5V to 6.4-to-11V. The other un-selected high voltage predecode signals PRMGBPU[7:1] and PRMGBPL[7:1] remain at about 3.5V. As a result, the potential of the selected high-side power supply line MGBP[0] rises from about 5.5V to 6.4-to-11V (VMGBPP), and the potential of the other un-selected high-side power supply line MGBP[63:1] is about (VMGBPN) 3.5V.

FIG. 15 is a timing chart of signals related to the MGBN decoder 54N illustrated in FIG. 5 in writing. With reference to FIG. 5 and FIG. 15, at time T0, the input address ADDB[5:0] changes to 00H, and the predecoder 480L on the lower address side selects a predecode signal PRMGBL[0], and the predecoder 480U on the upper address side selects a predecode signal PRMGBU[0]. The other predecode signals PRMGBL[7:1] and PRMGBU[7:1] are not selected. In writing, the inversion control signal ENOR is non-active.

At this time T0, the high-side power supply potential VMGBNP currently supplied to the level shifter 521 and the high voltage logic circuit 522 is 3.5V, and the low-side power supply potential VMGBNN is 0V. Accordingly, the voltage of the high voltage predecode signal PRMGBNU[0] and PRMGBNL[0] after the level conversion is about 3.5V, and the voltage of the other un-selected high voltage predecode signals PRMGBNU[7:1] and PRMGBNL[7:1] becomes 0V.

At this time T0, the cutoff signal ENN currently supplied to the level shifter 521 is about 3.5V (H level). Accordingly, the built-in CMOS latch circuit 5111 is not latched, but the output signal of the level shifter 521 changes depending on the selection/non-selection of the low voltage predecode signal.

After the logical operation of the high voltage predecode signals PRMGBNU and PRMGBNL is performed by the high voltage logic circuit 522, the voltage according to the logical operation result is supplied to the low-side power supply line MGBN[63:0]. Accordingly, only the voltage of the low-side power supply line MGBN[0] coupled to the high voltage logic circuit 522 (equivalent to an AND circuit) to which the high voltage predecode signals PRMGBNU[0] and PRMGBNL[0] are inputted becomes about 3.5V (VMGBNP), and the voltage of the other low-side power supply line MGBN[63:1] becomes 0V (VMGBNN).

Next, at time T2, the cutoff signal ENN changes from an H level (3.5V) to an L level (0V). Accordingly, the input signal to the level shifter 521 is cut off, and the state in which data is latched to the built-in CMOS latch circuit 5111 is realized.

Subsequently, from time T3 to time T4, the low-side power supply potential VMGBNN supplied to the level shifter 521 and the high voltage logic circuit 521 rises from 0V to about 1.5V. The High-side power supply potential VMGBNP remains at about 3.5V. With this change of the power supply potential, the selected high voltage predecode signals PRMGBNU[0] and PRMGBNL[0] remain at about 3.5V. However, the other un-selected high voltage predecode signals PRMGBNU[7:1] and PRMGBNL[7:1] rise from 0V to about 1.5V. As a result, the potential of the selected low-side power supply line MGBN[0] remains at about 3.5V (VMGBNP); however, the potential of the un-selected low-side power supply line MGBN[63:1] rises from 0V to about 1.5V (VMGBNN).

FIG. 16 is a timing chart of signals related to the MGG decoder 53G illustrated in FIG. 7 in writing. As illustrated in FIG. 16, the waveform of the potential of the power supply lines MGBP[0] and MGBN[0] of the MG driver circuit 24 corresponding to the selected block and the waveform of the potential of the power supply lines MGBP[1] and MGBN[1] of the MG driver circuit 24 corresponding to the un-selected block are the same as ones shown in FIG. 14 and FIG. 15. The control signal line MGG[0] for the gate drive of the MG driver is in the selected state (L level) after time T0, and other control signal lines MGG[1]-MGG[N−1] are in the un-selected state (H level) after time T0. At the time of the write operation after time T4, the potential of the selected control signal line MGG[0] becomes the VMGGN (3.5V), and the potential of the un-selected control signal line MGG[1] becomes the VMGGP (6.4 to 11V).

Accordingly, as for the selected block BK[0], the potential VMGBPP (6.4 to 11V) of the high-side power supply line MGBP[0] is applied to the selected memory gate line MGL[0] after time T4. The potential VMGBNP (3.5V) of the low-side power supply line MGBN[0] is applied to the un-selected memory gate line MGL[1] after time T4.

On the other hand, as for the un-selected block BK[1], after time T4, the potential of the high-side power supply line MGBP[1] becomes VMGBPN (3.5V), and the potential of the low-side power supply line MGBN[1] becomes a VMGBNN (1.5V). These potential are below the potential VMGGN (3.5V) of the selected control signal line MGG, and at the same time, they are below the potential VMGGP (6.4 to 11V) of the un-selected control signal line MGG[1]. Accordingly, the potential of the un-selected memory gate line MGL[1] and the potential of the selected memory gate line MGL[0] both become equal to the potential VMGBNN (1.5V) of the low-side power supply line MGBN[1] after time T4. As a result, after time T4, the voltage applied to the memory gate MG of each memory cell is the same as the case of FIG. 13.

[Operation of the MG Decoder Unit - - - Erasing]

Next, the operation of the MG decoder unit 25A illustrated in FIG. 5 in erasing is explained.

(Outline of Operation)

FIG. 17 is a schematic drawing illustrating a bias state of a selected/un-selected memory cell in erasing. With reference to FIG. 5 and FIG. 17, selection of a block BK by the MGBP/MGBN decoder 54 is explained first. The predecoders 480L and 480U both output a signal of an H level ("1") as the predecode signals PRMGBL and PRMGBU corresponding to the selected block BK. Since the inversion control signal ENOR in erasing is at an H level, the logical level of these predecode signals PRMGBL and PRMGBU is inverted by the EXOR gate 520, and all become an L level ("0"). In erasing, the high voltage logic circuit 522 operates as an OR circuit.

Here, the all-selection signal ASEL is activated in erasing; accordingly, the output of the high voltage AND circuit 512 always becomes an H level. Therefore, the high-side power supply potential VMGBPP (for example, 1.5V as illustrated in FIG. 8) supplied to the high voltage AND circuit 512 is applied to all the high-side power supply lines MGBP[63:0] of the MG driver circuit 24 (irrespective of selection/non-selection).

On the other hand, in the MG driver circuit 24, the low-side power supply potential VMGBNN (for example, −3.3 to −8.0V as illustrated in FIG. 8) supplied to the high voltage logic circuit 522 is applied to the low-side power supply line MGBN corresponding to the selected block BK. The high-side power supply potential VMGBNP (for example, 1.5V as illustrated in FIG. 8) supplied to the high voltage logic circuit 522 is applied to the low-side power supply line MGBN corresponding to the un-selected block BK.

Next, selection of the memory gate line MGL of each block BK is explained. In the following, for the sake of simplicity, it is assumed that the MGG decoder 53G illustrated in FIG. 7 is provided, in place of the MGP/MGN decoder 53 and that the control signal line MGG is provided in place of the control signal lines MGP and MGN. The predecode signals PRMGL and PRMGU corresponding to the selected memory gate line MGL (selected cell) are at an H level; however, these predecode signals PRMGL and PRMGU are inverted to an L level by the EXOR gate 550 illustrated in FIG. 7. In erasing, the high voltage logic circuit 552 illustrated in FIG. 7 operates as an NOR circuit. Accordingly, a signal at an H level, that is, the high-side power supply potential VMGGP (for example, 1.5V as illustrated in FIG. 8) of the high voltage logic circuit 522 illustrated in FIG. 7, is applied to the control signal line corresponding to the selected cell.

On the other hand, at least one of the predecode signals PRMGL and PRMGU corresponding to the un-selected memory gate line MGL (un-selected cell) is at an L level. However, since these predecode signals PRMGL and PRMGU are inverted by the EXOR gate 550 illustrated in FIG. 7, at least one of them becomes an H level. In erasing, the high voltage logic circuit 552 illustrated in FIG. 7 operates as an NOR circuit. Accordingly, a signal at an L level, that is, the low-side power supply potential VMGGN (for example, −3.3 to −8.0V illustrated in FIG. 8) of the high voltage logic circuit 522 illustrated in FIG. 7, is applied to the control signal line MGG corresponding to the un-selected cell.

According to the above, (A) the potential VMGBNN of the low-side power supply line MGBN (for example, −3.3 to −8.0V) is applied to the memory gate line MGL in the selected block BK (that is, the memory gate MG of the memory cell of the erasing target); and (B) the potential VMGBPP of the high-side power supply line MGBP (for example, 1.5V) is applied to the un-selected memory gate line MGL in the selected block BK.

On the other hand, the potential VMGBPP (for example, 1.5V) of the high-side power supply line MGBP corresponding to the un-selected block BK and the potential VMGBNP (for example, 1.5V) of the low-side power supply line MGBN corresponding to the un-selected block BK are set up equally. Therefore, (D) all the memory gate lines MGL corresponding to the un-selected block BK are set as un-selected irrespective of the selection/non-selection of the control signal line MGG, and the voltage is set to 1.5V in the example of FIG. 8. In the un-selected block BK in erasing, the state of the selected memory cell, that is, (C) of FIG. 17, does not exist.

(A Concrete Example of Operation)

Figure 18:
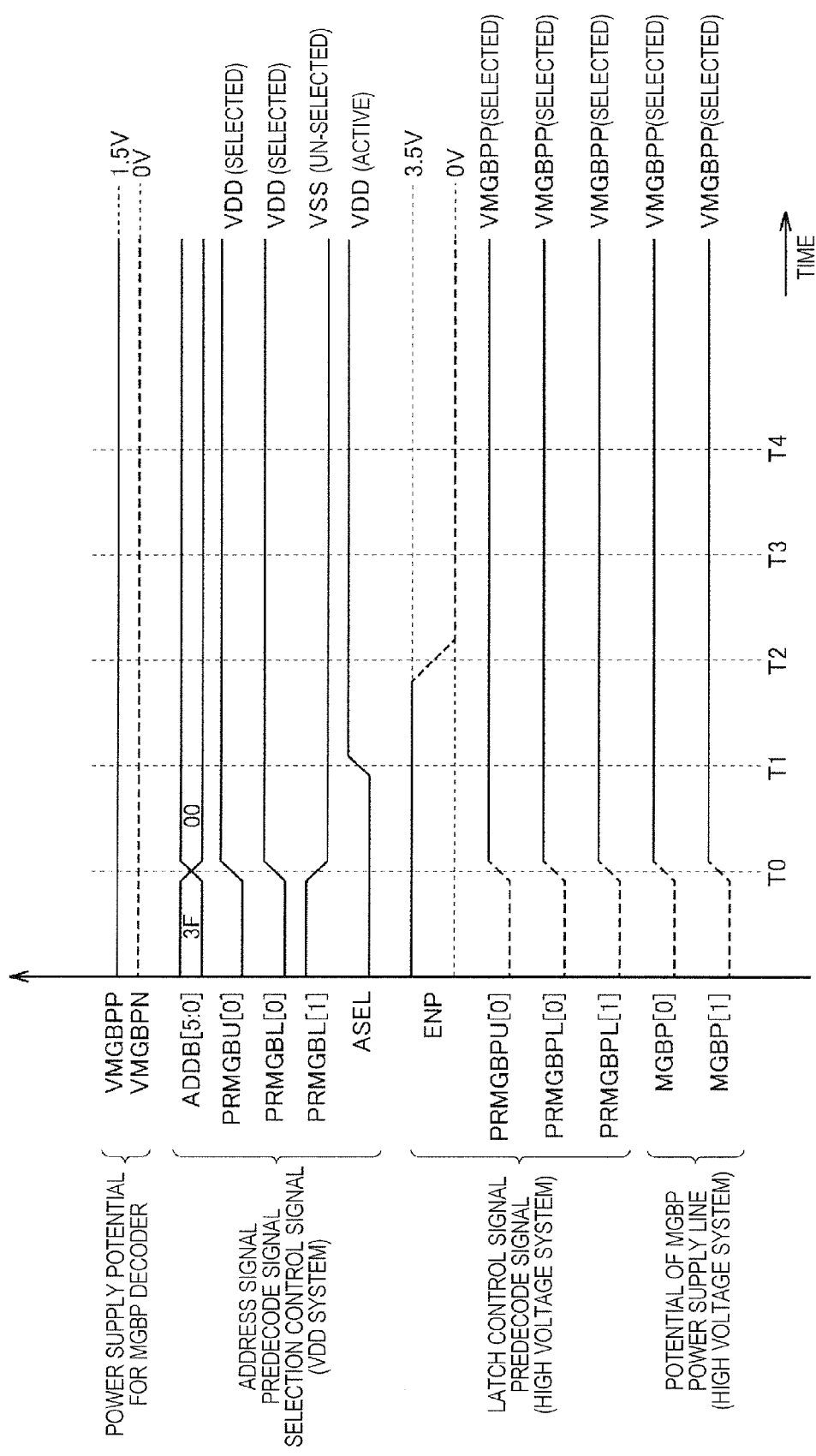
FIG. 18 is a timing chart of signals related to the MGBP decoder illustrated in FIG. 5 in erasing.
Figure 19:
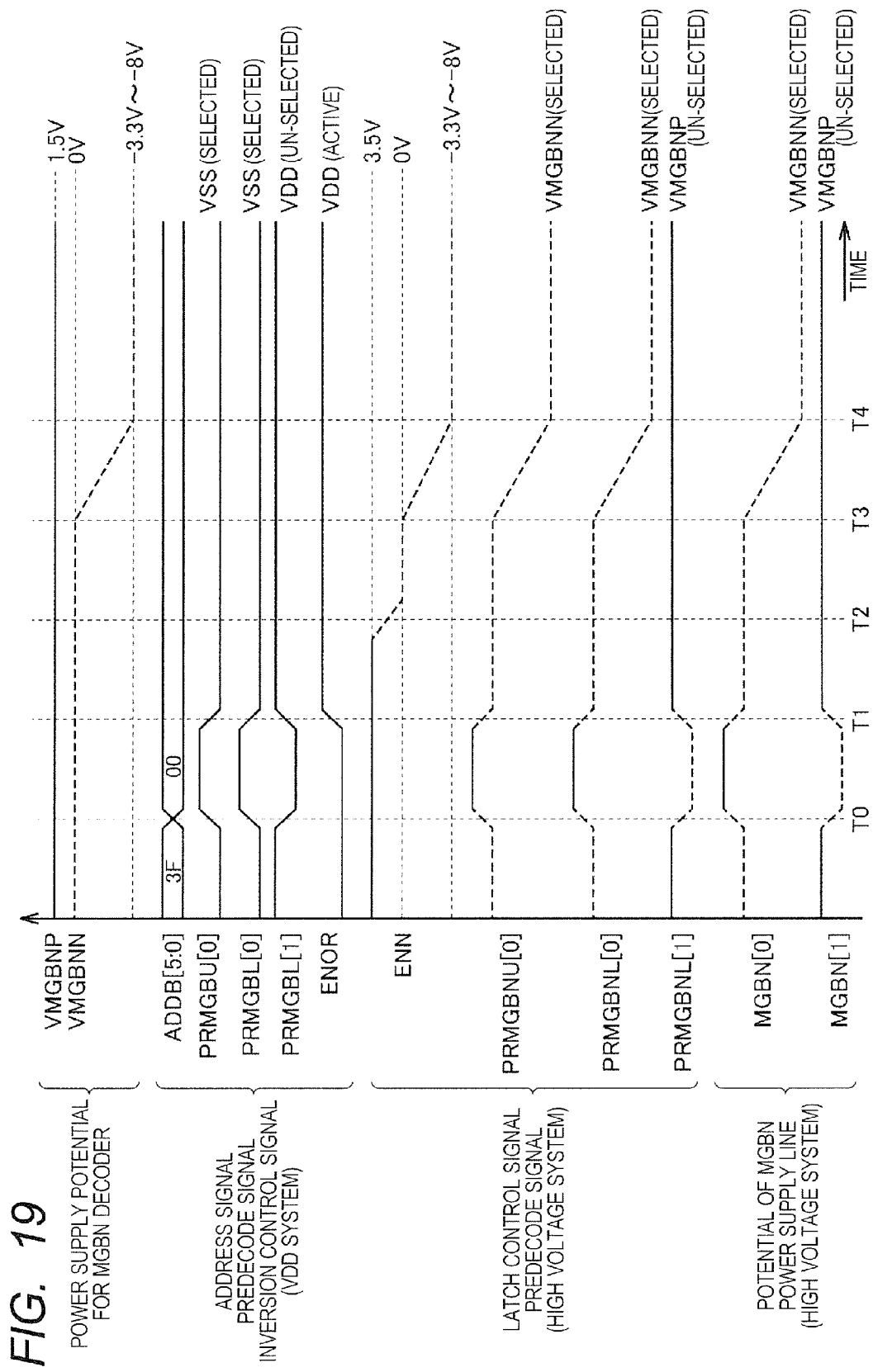
FIG. 19 is a timing chart of signals related to the MGBN driver illustrated in FIG. 5 in erasing.
Figure 20:
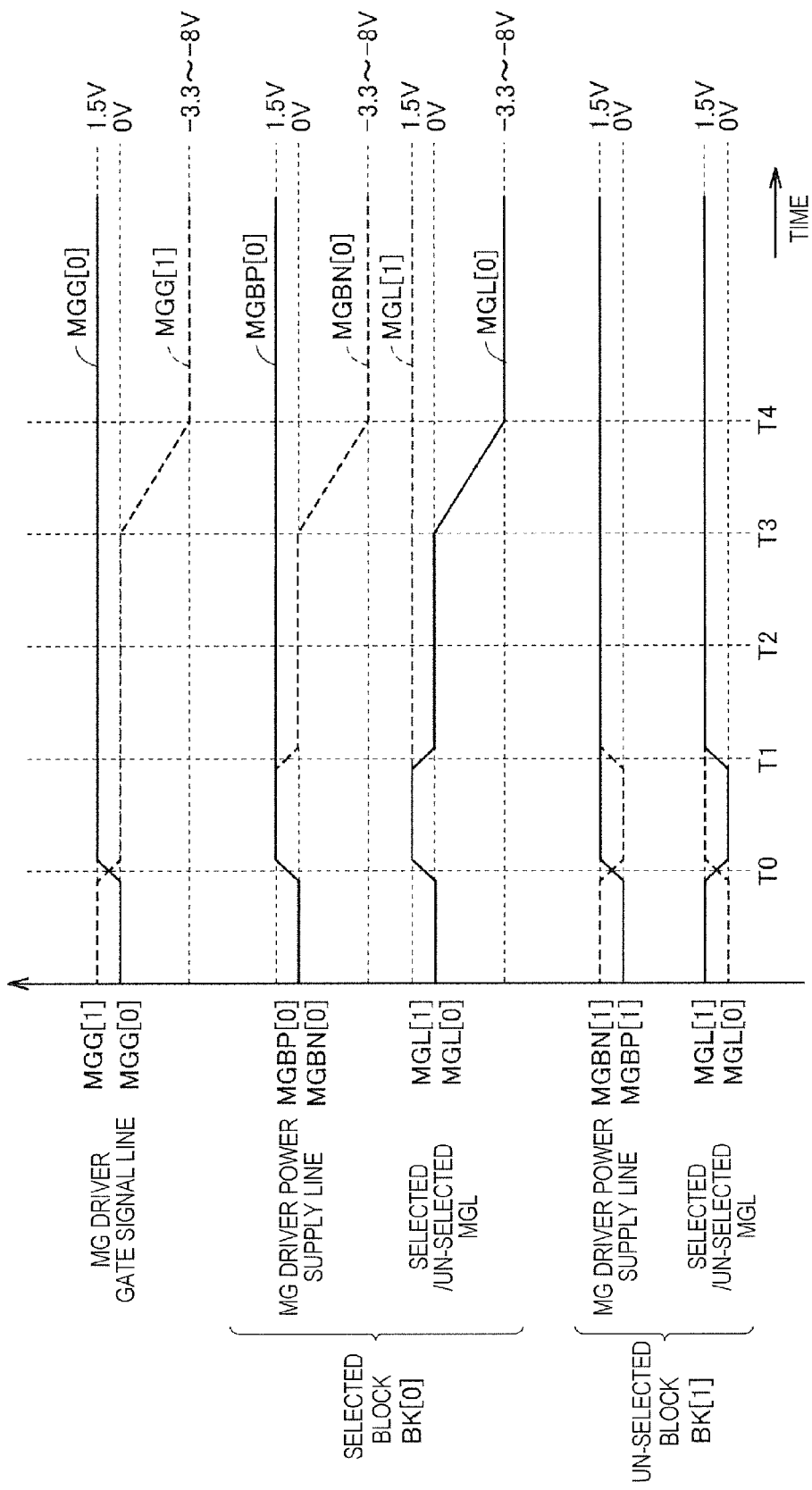
FIG. 20 is a timing chart of signals related to the MGG decoder illustrated in FIG. 7 in erasing.

Hereinafter, with reference to FIG. 5 and FIG. 18 through FIG. 20, a concrete example of the operating sequence of the MG decoder unit 25A in erasing is explained. In FIG. 18 through FIG. 20, at time T0, it is assumed that the input address ADDB[5:0] to the MGBP/MGBN decoder 54 changes to 00H.

FIG. 18 is a timing chart of signals related to the MGBP decoder 54P illustrated in FIG. 5 in erasing. With reference to FIG. 5 and FIG. 18, at time T0, the input address ADDB[5:0] changes to 00H, and the predecoder 480L on the lower address side selects the low voltage predecode signal PRMGBL[0], and the predecoder 480U on the upper address side selects a low voltage predecode signal PRMGBU[0]. The other low voltage predecode signals PRMGBL[7:1] and PRMGBU[7:1] are not selected.

In erasing, the high-side power supply potential VMGBPP currently supplied to the level shifter 511 and the high voltage AND circuit 512 is fixed to 1.5V, and the low-side power supply potential VMGBPN is fixed to 0V. Accordingly, at time T0, the voltage of the high voltage predecode signals PRMGBPU[0] and PRMGBPL[0] after the level conversion is about 1.5V, and the voltage of the other un-selected high voltage predecode signals PRMGBPU[7:1] and PRMGBPL[7:1] becomes 0V.

At this time T0, the cutoff signal ENP currently supplied to the level shifter 511 is about 3.5V (H level). Accordingly, the built-in CMOS latch circuit 5111 is not latched, but the output signal of the level shifter 511 changes depending on the selection/non-selection of the predecode signals PRMGBL and PRMGBU.

Next, at time T1, the all-selection signal ASEL is activated. Accordingly, irrespective of the logical level of the predecode signals PRMGBU and PRMGBL, all the high voltage decode signals PRMGBPU and PRMGBPL become an H level (1.5V). The AND operation of the high voltage predecode signals PRMGBPU and PRMGBPL is performed by the high voltage AND circuit 512, and the AND operation result is outputted to the high-side power supply line MGBP [63:0] of the MG driver circuit 24. As a result, the voltage of all the high-side power supply lines MGBP [63:0] is set to VMGBPP (1.5V).

Next, at time T2, the cutoff signal ENP changes from an H level (about 3.5V) to an L level (about 0V). Accordingly, the input signal to the level shifter 511 is cut off, and the state in which data is latched to the built-in CMOS latch circuit 5111 is realized.

Subsequently, the high-side power supply potential VMGBPP supplied to the level shifter 511 and the high voltage AND circuit 512 does not change. Therefore, the voltage of all the high-side power supply lines MGBP[63:0] of the MG driver circuit 24 remains at VMGBPP (1.5V).

FIG. 19 is a timing chart of the signals related to the MGBN decoder 54N illustrated in FIG. 5 in erasing. With reference to FIG. 5 and FIG. 19, at time T0, the input address ADDB[5:0] changes to 00H, and the predecoder 480L on the lower address side selects a low voltage predecode signal PRMGBL[0], and the predecoder 480U on the upper address side selects a low voltage predecode signal PRMGBU[0]. The other low voltage predecode signals PRMGBL[7:1] and PRMGBU[7:1] are not selected.

At this time T0, the high-side power supply potential VMGBNP currently supplied to the level shifter 521 and the high voltage logic circuit 522 is 1.5V, and the low-side power supply potential VMGBNN is 0V. Accordingly, the voltage of the high voltage predecode signals PRMGBNU[0] and PRMGBNL[0] after the level conversion is about 1.5V, and the voltage of the other un-selected high voltage predecode signals PRMGBNU[7:1] and PRMGBNL[7:1] becomes 0V.

At this time T0, the cutoff signal ENN currently supplied to the level shifter 521 is about 3.5V (H level). Accordingly, the built-in CMOS latch circuit 5111 is not latched, but the output signal of the level shifter 521 changes depending on the selection/non-selection of the predecode signals PRMGBL and PRMGBU.

At the next time T1, the inversion control signal ENOR is activated. Accordingly, the EXOR gate 520 inverts the logical level of the predecode signals PRMGBU and PRMGBL. As a result, only the selected high voltage predecode signals PRMGBNU[0] and PRMGBNL[0] become an L level (potential VMGBNN:0V), and the other un-selected high voltage predecode signals PRMGBNU[7:1] and PRMGBNL[7:1] become an H level (potential VMGBNP:1.5V).

When the inversion control signal ENOR is activated, the high voltage logic circuit 522 operates as an OR circuit. Therefore, only the high voltage logic circuit 522 to which the selected high voltage predecode signals PRMGBNU[0] and PRMGBNL[0] are inputted outputs the low-side power supply potential VMGBNN (0V) to the corresponding power supply line MGBN[0]. Other high voltage logic circuits 522 output the high-side power supply potential VMGBNP (1.5V) to the corresponding the power supply line MGBN[0].

At the next time T2, the cutoff signal ENN changes from an H level (3.5V) to an L level (0V). Accordingly, the input signal to the level shifter 521 is cut off, and the state in which data is latched to the built-in CMOS latch circuit 5111 is realized.

Subsequently, from time T3 to time T4, the low-side power supply potential VMGBNN supplied to the level shifter 521 and the high voltage logic circuit 521 falls from 0V to the memory gate voltage −3.3 to −8.0V to enable erasing. The High-side power supply potential VMGBNP remains at about 1.5V. With this change of the power supply potential, the selected high voltage predecode signals PRMGBNU[0] and PRMGBNL[0] fall to about −3.3 to −8.0V. However, the other un-selected high voltage predecode signals PRMGBNU[7:1] and PRMGBNL[7:1] remain unchangeably at about 1.5V. As a result, the selected low-side power supply line MGBN[0] falls to about −3.3 to −8.0V (VMGBNN). As opposed to this, the un-selected low-side power supply line MGBN[63:1] remains at about 1.5V (VMGBNP).

FIG. 20 is a timing chart of signals related to the MGG decoder 53G illustrated in FIG. 7 in erasing. As illustrated in FIG. 20, the waveform of the potential of the power supply lines MGBP[0] and MGBN[0] of the MG driver circuit 24 corresponding to the selected block and the waveform of the potential of the power supply lines MGBP[1] and MGBN[1] of the MG driver circuit 24 corresponding to the un-selected block are the same as ones shown in FIG. 18 and FIG. 19. The control signal line MGG[0] for the gate drive of the MG driver is in the selected state (H level) after time T0, and other control signal lines MGG[1]-MGG[N−1] are in the un-selected state (L level) after time T0. In the erasing operation after time T4, the voltage of the selected control signal line MGG[0] remains at 1.5V. However, the voltage of the un-selected control signal line MGG[1] falls to −3.3 to −8.0V.

Accordingly, as for the selected block BK[0], the potential VMGBNN (−3.3 to −8.0V) of the low-side power supply line MGBN[0] is applied to the selected memory gate line MGL[0] after time T4. The potential VMGBPP (1.5V) of the high-side power supply line MGBP [0] is applied to the un-selected memory gate line MGL[1] after time T4.

On the other hand, as for the un-selected block BK[1], the potential VMGBPP (1.5V) of the high-side power supply line MGBP[1] and the potential VMGBNP (1.5V) of the low-side power supply line MGBN[1] become equal after time T1. Accordingly, irrespective of the potential of the control signal line MGG, each voltage of the memory gate lines MGL[0]-MGL[N−1] becomes equal to 1.5V which is the voltage of the high-side power supply line MGBP[1] and the low-side power supply line MGBN[1]. As a result, after time T4, the voltage applied to the memory gate MG of each memory cell is the same as the case of FIG. 17.

[Effect]

Hereinafter, the effect of Embodiment 1 is explained. The following explains, as examples, the case where a 6-bit address signal ADDB[5:0] is inputted to the MGBN decoder 54N illustrated in FIG. 5, or the case where a 6-bit address signal ADDG[5:0] is inputted to the MGN decoder 53N illustrated in FIG. 6 or to the MGG decoder 53G illustrated in FIG. 7. In this case, in the related art technology, it is necessary to perform the level conversion of 64 pieces of decode signals of a VDD level obtained by decoding whole 6 bits, requiring 64 level shifters. As compared with this, in Embodiment 1, it is only necessary to perform the level conversion of 17 pieces of signals combining two groups of eight predecode signals and the inversion control signal ENOR. Accordingly, the necessary number of level shifters can be reduced to 17 pieces. In this way, according to the present embodiment, it is possible to reduce the number of level shifters which have a comparatively large area.

Here, an issue in the decode circuit of the nonvolatile memory is that it is necessary to output a positive and a negative high voltage. Specifically, the voltage outputted to the low-side power supply line MGBN of the MG driver circuit 24 from the MGBN decoder 54N illustrated in FIG. 5 can take a positive and a negative high voltage. In cases where the output voltage is a positive high voltage such as in writing, it is necessary to set the selection signal at a high voltage rather than the non selection signal. Therefore, the selection signal corresponds to an H level and the non selection signal corresponds to an L level. In this case, it is necessary for the decode circuit which decodes the predecode signal to adopt AND logic so as to be selected when all the predecode signals are at an H level. As opposed to this, when the output voltage is a negative high voltage such as in erasing, it is necessary to set the selection signal at a low voltage rather than the non selection signal. Therefore, the selection signal corresponds to an L level and the non selection signal corresponds to an H level. In this case, it is necessary for the decode circuit which decodes the predecode signal to adopt OR logic.

In Embodiment 1, the above-described issue is solved by providing the EXOR gate 520 in the preceding stage of the level shifter 521, and providing the high voltage logic circuit 522 in the subsequent stage of the level shifter 521. In this case, the operation of the EXOR gate 520 and the high voltage logic circuit 522 is controlled based on the inversion control signal ENOR. Specifically, the EXOR gate 520 inverts the predecode signal when a negative high voltage is outputted to the power supply line MGBN. The high voltage logic circuit 522 performs the AND operation of the predecode signals, when a positive high voltage is outputted to the power supply line MGBN (when the inversion control signal ENOR is at an L level), and performs the OR operation of the predecode signals when a negative high voltage is outputted to the power supply line MGBN (when the inversion control signal ENOR is at an H level).

The voltage outputted to the high-side power supply line MGBP of the MG driver circuit 24 from the MGBP decoder 54P illustrated in FIG. 5 can take only a positive high voltage. Therefore, in the present case, what is necessary is just to provide the high voltage AND circuit 512 which performs the AND operation of the predecode signals converted into a high voltage by the level shifter 511; accordingly, the circuit configuration becomes simple compared with the case of the low-side power supply line MGBN.

Hereinafter, the effect of the area reduction is explained in more detail. In the case of the MGBN decoder 54N illustrated in FIG. 5, 64 pieces of the level shifters required in the related art technology can be reduced to 17 pieces as described above. However, in Embodiment 1, extra 64 pieces of the high voltage logic circuit 522 are required. In fact, the circuit area of the high voltage logic circuit 522 is small enough compared with the circuit area of the level shifter; therefore, even if the extra increase of the circuit area of the high voltage logic circuit 522 is considered, the nonvolatile memory according to Embodiment 1 occupies a further smaller area than the counterpart of the related art technology. The reason is as follows.

First, the MG decoder unit 25A does not require a high-speed operation; therefore, it is possible to form almost all portions with MOS transistors of the minimum size. Accordingly, it is possible to form the high voltage logic circuit 522 illustrated in FIG. 12 with 12 pieces of MOS transistors of the minimum size. As compared with this, the level shifter 521 illustrated in FIG. 9 needs to increase the gate width of the PMOS transistor compared with the gate width of the NMOS transistor, in order to secure the operation margin. On the other hand, in order to secure the inversion margin, it is necessary to enhance the driving capability of the NMOS transistor in the input part compared with the PMOS transistor in the latch circuit part. In this way, the level shifter 521 requires a transistor with a comparatively large size due to the imbalanced configuration.

This point will be further discussed more concretely, with reference to FIG. 9. First, when the inversion margin of the level shifter 511 (521) is considered, what is important is the ratio of the PMOS transistors MP10 and MP11 which configure the latch circuit 5111, and the input NMOS transistors MN12, MN14, MN13 and MN15. At the time of inverting the latch circuit 5111, the high-side power supply potential (VMGBPP, VMGBNP) applied to the level shifter is at the VDD level, the low-side power supply potential (VMGBPN, VMGBNN) is at the GND level, and the input signal INP/INN is a signal of a VDD-GND level. On the other hand, the MOS transistor which configures the level shifter 511 (521) is a thick film MOS transistor which is expected to be used at a high voltage; accordingly, the threshold level thereof is high, compared with a thin film MOS transistor which is premised on the use at a VDD voltage. Under such conditions, an NMOS transistor exhibits a weak driving capability, compared with a PMOS transistor. For that reason, in the example illustrated in FIG. 9, when the PMOS transistors MP10 and MP11 are designed so as to have the minimum gate width and the minimum gate length, the NMOS transistors MN12, MN14, MN13, and MN15 need to enlarge the gate width in order to improve the driving capability. This is because otherwise, it becomes impossible to invert the latch circuit.

The more the miniaturization advances and the more the VDD level decreases, the weaker the driving capability of the NMOS transistor becomes. Accordingly, the ratio of a PMOS transistor to an NMOS transistor tends to increase further. For example, when it assumes that the size of an NMOS transistor must be enlarged 4 times to the size of a PMOS transistor, it is necessary to set the gate width as 8 for the NMOS transistors MN12, MN14, MN13, and MN15, to the gate width of 1 for the PMOS transistors MP10 and MP11.

Next, when the stability of the level shifter is considered, as for the transistors configuring the latch circuit 5111, it is desirable to keep almost constant the ratio of the capability of the PMOS transistors MP10 and MP11 to the capability of the NMOS transistors MN10 and MN11. Generally the driving capability of an NMOS transistor is roughly twice the driving capability of a PMOS transistor. Therefore, it is common to set the gate width of the PMOS transistor roughly twice the gate width of the NMOS transistor. However, in the case of the level shifter 511 (521) illustrated in FIG. 9, when the gate width of the PMOS transistors MP10 and MP11 is enlarged, the gate width of the input NMOS transistors MN12, MN14, MN13, and MN15 must be enlarged further. Therefore, better area efficiency is obtained by equalizing the gate width and setting the gate length of an NMOS transistor twice the gate length of a PMOS transistor. In the example of FIG. 9, when the gate length of the PMOS transistors MP0 and MP1 is set to 1, the gate length of the NMOS transistors MN0 and MN1 is set to 2.

In order to make the load constant at the cross coupling nodes ND12 and ND13 of the level shifter 511 and 521, it is necessary to add the CMOS inverter 5112 (transistors MP16 and MN16) and the CMOS inverter 5113 (transistors MP7 and MN7) to the nodes ND12 and ND13, respectively. However, it is no matter if the size of the transistors MP16, MN16, MP17, and MN17 which configure these CMOS inverters is minimal.

In the above-described example, when the size of the high voltage logic circuit 522 and the size of the level shifter 511 (521) are derived from a gate width/gate length ratio simply, it becomes as follows.

First, as for the high voltage logic circuit 522, the gate width/gate length ratio of each of the transistors MP40-MP44, MN40-MN44 is 1. Accordingly, the total size becomes 10 (the buffer configured with the transistors MP45 and MN45 is excluded from the evaluation of the size, because they are necessary also in the configuration according to the related art technology).

Next, as for the level shifters 511 and 512, the gate width/gate length ratio of each of the transistors MP10 and MP11 is 1, and the gate width/gate length ratio of each of the transistors MN10 and MN11 is 2. The gate width/gate length ratio of each of the transistors MN12-MN15 is 8, and the gate width/gate length ratio of each of the transistors MP16, MP17, MN16, and MN17 is 1. Accordingly, the total size becomes 42. Although not shown in FIG. 9, there may arise cases where an extra element is required for relaxation of the withstand voltage and it is necessary to make the gate length of the MOS transistor of the cross coupling part larger than the minimum value from the viewpoint of reliability. Accordingly, it is possible that the circuit area of the level shifter becomes still larger.

From the above argument, it is assumed that the area of the level shifters 511 and 512 is 5 times the area of the high voltage logic circuit 522 in the area ratio. Then, on the basis of the area of one piece of the high voltage logic circuit 522, the area of 64 level shifters according to the related art technology is 64×5=320. As opposed to this, the area of the level shifter and the high voltage logic circuit 522 according to Embodiment 1 becomes 17×5+64×1=149. Accordingly, there is more than twice as many area efficiency in the case of Embodiment 1, compared with the case of the related art technology.

As a more concrete example, the following examines the case of an 8-Mbyte flash module of 4 k bits in the row direction by 4 k bits in the column direction. In the present case, 4 k pieces of memory gate lines MGL are decoded with the use of a 12-bit address. Specifically, In the MG decoder unit 25A illustrated in FIG. 5, 6 bits are assigned to the MGBP/MGBN decoder 54 (that is, selection of the block BK), and 6 bits are assigned to the MGG decoder (that is, selection of the memory gate line MGL). It is necessary to output a positive high voltage and a negative high voltage in these decoder circuits. Therefore, it is possible to apply Embodiment 1 suitably to the flash memory concerned, with the expectation that a 50% or more reduction of area can be realized as described above, compared with the decoder circuit according to the related art technology.

Embodiment 2

The Configuration of the High Voltage Logic Circuit 522A

Figure 21:
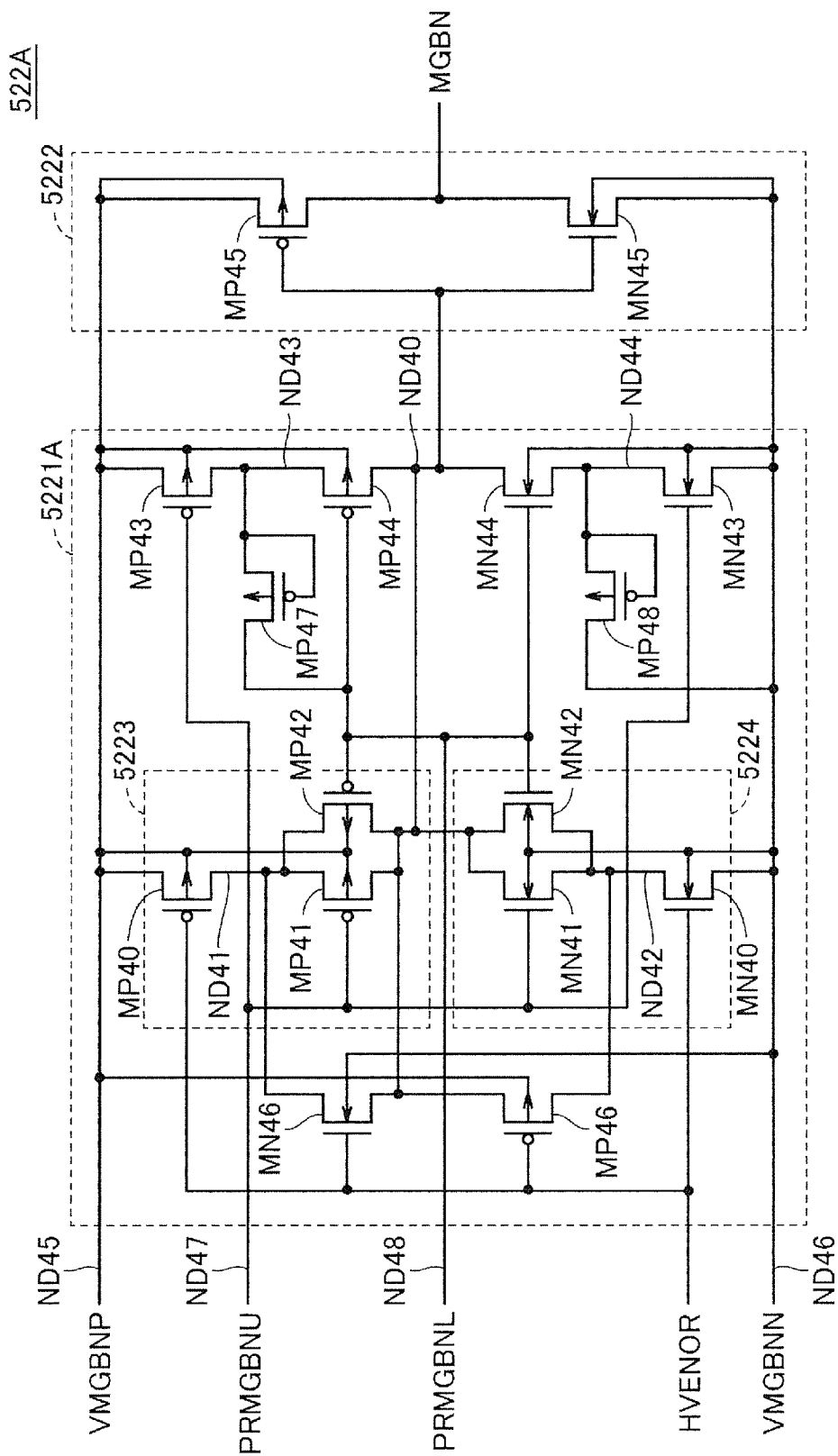
FIG. 21 is a drawing illustrating the configuration of a high voltage logic circuit in the semiconductor device according to Embodiment 2.

FIG. 21 is a drawing illustrating the configuration of a high voltage logic circuit 522A in a semiconductor device according to Embodiment 2. The high voltage logic circuit 522A (NAND/NOR circuit 5221A) illustrated in FIG. 21 is a modified example of the high voltage logic circuit 522 (NAND/NOR circuit 5221) illustrated in FIG. 12. That is, the semiconductor device according to Embodiment 2 differs from the semiconductor device according to Embodiment 1 in that the configuration of the high voltage logic circuit 522 is replaced with the configuration illustrated in FIG. 21. The high voltage logic circuit 542 illustrated in FIG. 6 and the high voltage logic circuit 552 illustrated in FIG. 7 can be also modified as is the case with FIG. 21. The other points of Embodiment 2 is the same as those of Embodiment 1.

With reference to FIG. 21, the high voltage logic circuit 522A differs from the high voltage logic circuit 522 illustrated in FIG. 12 in that an NMOS transistor MN46, PMOS transistors MP46, MP47, and MP48 are further included.

Specifically, the NMOS transistor MN46 is coupled between an intermediate node ND41 of the PMOS transistors MP40 and MP41 and an intermediate node ND40. The PMOS transistor MP46 is coupled between an intermediate node ND42 of the NMOS transistors MN40 and MN41 and an intermediate node ND40. An inversion control signal HVENOR is supplied to the gates of the transistors MN46 and MP46.

The PMOS transistor MP47 is coupled between an intermediate node ND43 of the PMOS transistors MP43 and MP44 and an input node ND48 of the predecode signal PRMGBNL. The gate of the PMOS transistor MP47 is coupled to the intermediate node ND43. The PMOS transistor MP48 is coupled between an intermediate node ND44 of the NMOS transistors MN43 and MN44 and a low-side power supply node ND46. The gate of the PMOS transistor MP48 is coupled to the intermediate node ND44. The configuration of other parts of FIG. 21 is the same as that of FIG. 12. Therefore, the same symbol or reference numeral is attached to the same or corresponding element and the explanation thereof is not repeated.

[The Effect of the High Voltage Logic Circuit 522A]

By replacing the high voltage logic circuit 522 illustrated in FIG. 12 with the high voltage logic circuit 522A illustrated in FIG. 21, as described above, there are advantages in treating a high voltage beyond the withstand voltage of the MOS transistor in the MGBP/MGBN decoder 54 illustrated in FIG. 5.

For example, it is assumed that the withstand voltage of a MOS transistor is about 10V. In this case, when the low-side power supply potential VMGBPN supplied to the level shifter 511 and the high voltage AND circuit 512 in the MGBP/MGBN decoder 54 remains at VSS (=0V), the high-side power supply potentials VMGBPP of these circuits can rise only up to 10 v at maximum. Therefore, the highest potential of each high-side power supply line MGBP in the MG driver circuit 24 becomes also about 10V. However, when the low-side power supply potential VMGBPN is raised to 4V after setting data to the latch-type level shifter 511 in the state where the absolute value of the power supply potentials VMGBPP and VMGBPN is small (VDD level), the high-side power supply potential VMGBPP can rise up to about 14V. As a result, the potential of each high-side power supply line MGBP in the MG driver circuit 24 can also be set at about 14V.

Similarly, when the high-side power supply potential VMGBNP supplied to the level shifter 521 and the high voltage logic circuit 522 remains at VDD (=1.5V), the low-side power supply potential VMGBNN of these circuits can fall only to about −8.5V. Therefore, the lowest potential of each low-side power supply line MGBN in the MG driver circuit 24 becomes also about −8.5V. However, when the high-side power supply potential VMGBNP is lowered to −4V, after setting data to the latch-type level shifter 521 in the state where the absolute value of the power supply potentials VMGBNP and VMGBNN is small (VDD level), the low-side power supply potential VMGBNN can be stepped down to about −14V. As a result, the potential of each low-side power supply line MGBN in the MG driver circuit 24 can also be set at about −14V.

As described above, in the MGBP/MGBN decoder 54 and the MGP/MGN decoder 53 illustrated in FIG. 5, by setting the low-side power supply potential at a higher potential than the VSS or setting the high-side power supply potential at a lower potential than the VSS, it becomes possible to set the power supply potential of another side at the value higher than the withstand voltage of the MOS transistor.

However, the potential of the intermediate nodes ND41-ND44 of the high voltage logic circuit 522 poses an issue at this time. Specifically, in the case of the high voltage logic circuit 522 illustrated in FIG. 12, the intermediate nodes ND41-ND44 can be floating, depending on the combination of the input signals (PRMGBNU, PRMGBNL). If the power supply potentials VMGBNP and VMGBNN are changed in a large range in such a floating state, a large potential difference may be generated between the intermediate nodes ND41-ND44 and other nodes, and a voltage higher than the withstand voltage may be built over the MOS transistor.

In the high voltage logic circuit 522A illustrated in FIG. 21, it is possible to avoid such a state with the help of four clamp MOS transistors MN46, MP46, MP47, and MP48. This is because these MOS transistors MN46, MP46, MP47, and MP48 serve so as to clamp the potential of the intermediate nodes ND42, ND43, and ND44 to a suitable potential, respectively. Hereinafter, the explanation is made in more detail, comparing the voltage change of each part of the high voltage logic circuit 522 illustrated in FIG. 12 with the voltage change of each part of the high voltage logic circuit 522A illustrated in FIG. 21.

[An Example of Operation of the High Voltage Logic Circuit]

(Operation of the High Voltage Logic Circuit 522 of FIG. 12 - - - a Comparative Example)

Figure 22:
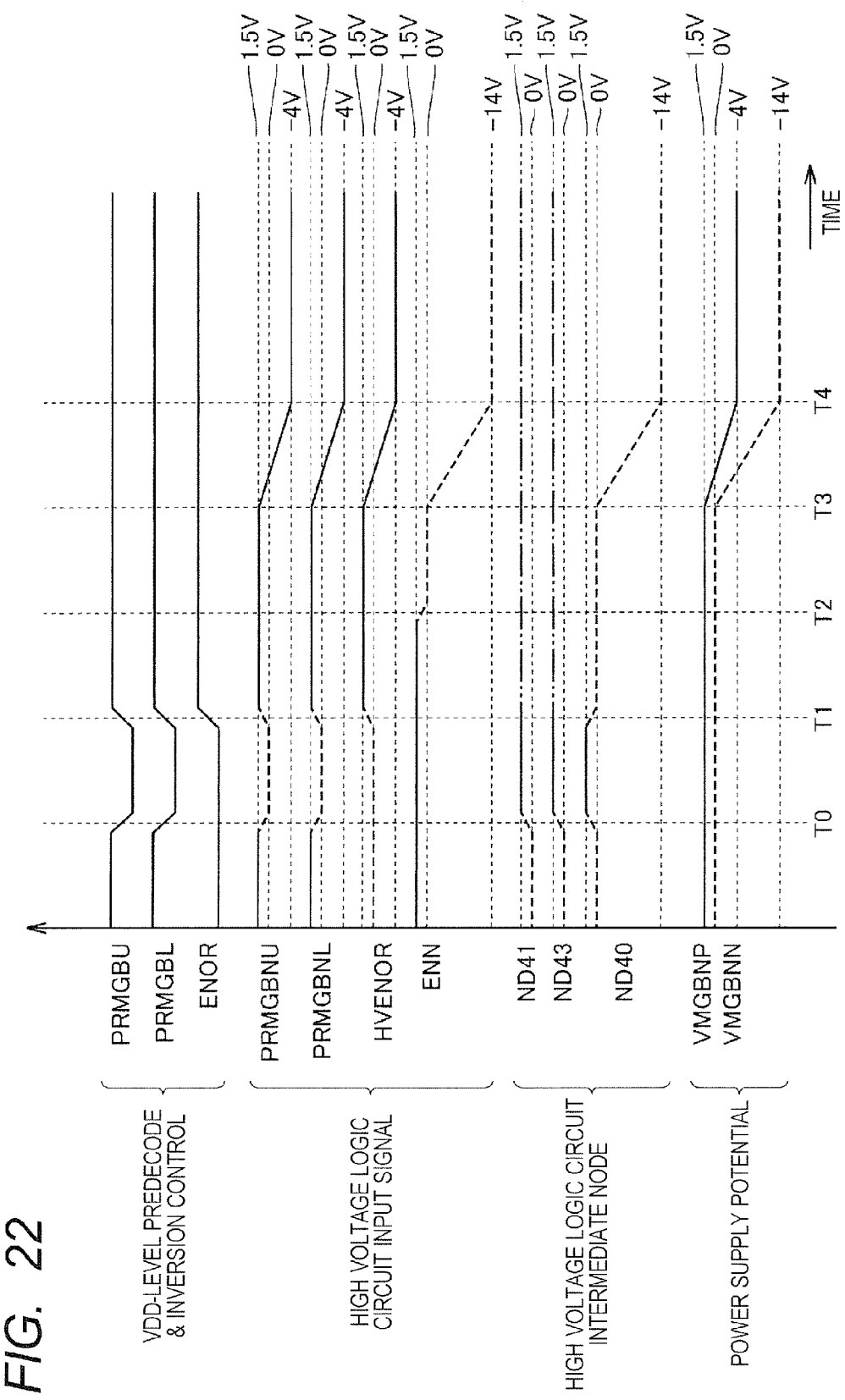
FIG. 22 is a timing chart illustrating an example of the voltage change of each part of the high voltage logic circuit illustrated in FIG. 12.

FIG. 22 is a timing chart illustrating an example of the voltage change of each part of the high voltage logic circuit 522 illustrated in FIG. 12. The timing chart of FIG. 22 illustrates the time changes of the input signal to the high voltage logic circuit 522 and the voltage at the intermediate nodes ND40, ND41, and ND43, when the voltage to be outputted to the power supply line MGBN is reduced to −14V.

With reference to FIG. 12 and FIG. 22, at Time t0, both the predecode signals PRMGBU and PRMGBL at a VDD level change to an L level, and both the high voltage predecode signals PRMGBNU and PRMGBNL change to an L level (that is, the power supply line MGBN illustrated in FIG. 12 is in a un-selected state). As a result, all of the PMOS transistors MP40, MP41, MP42, and MP43 become in an ON state. Therefore, all the voltage at the intermediate nodes ND40, ND41, and ND43 become equal to the potential VMGBNP at the high-side power supply node ND45 (=1.5V).

At the next time T1, the inversion control signal ENOR is set to an H level, and the level-converted inversion control signal HVENOR is also set to an H level. The inversion control signal ENOR is activated to an H level, and both the predecode signals PRMGBU and PRMGBL of a VDD level are inverted from an L level to an H level. Therefore, both the high voltage predecode signals PRMGBNU and PRMGBNL are inverted from an L level to an H level. As a result, all of the PMOS transistors MP40, MP41, MP42, and MP43 become in an OFF state, and the NMOS transistors MN43 and MN44 become in an ON state. Accordingly, the potential at the intermediate node ND40 becomes equal to the potential VMGBNN at the low-side power supply node ND46 (=0V). Furthermore, the intermediate nodes ND41 and ND43 become floating.

At the next time T2, the cutoff signal ENN changes to an L level, and data is latched to the level shifter 522.

Subsequently, from time T3 to time T4, the potential VMGBNP at the high-side power supply node ND45 falls from 0V to −4V, and the potential VMGBNN at the low-side power supply node ND46 falls from 0V to −14V. During this period, the intermediate nodes ND41 and ND43 remains to be floated. Accordingly, the original potential value of 1.5V is continuously held. Therefore, the voltage of 1.5V−(−14V)= 15.5V is built between the source and the drain of the PMOS transistors MP41, MP42, and MP44. This voltage is over the withstand voltage 10V of the MOS transistor currently assumed. In order to avoid this, in Embodiment 2, the high voltage logic circuit 522A of FIG. 21 is employed.

(Operation of the High Voltage Logic Circuit 522A of FIG. 21 - - - a Case of Reducing the Low-Side Power Supply Potential)

Figure 23:
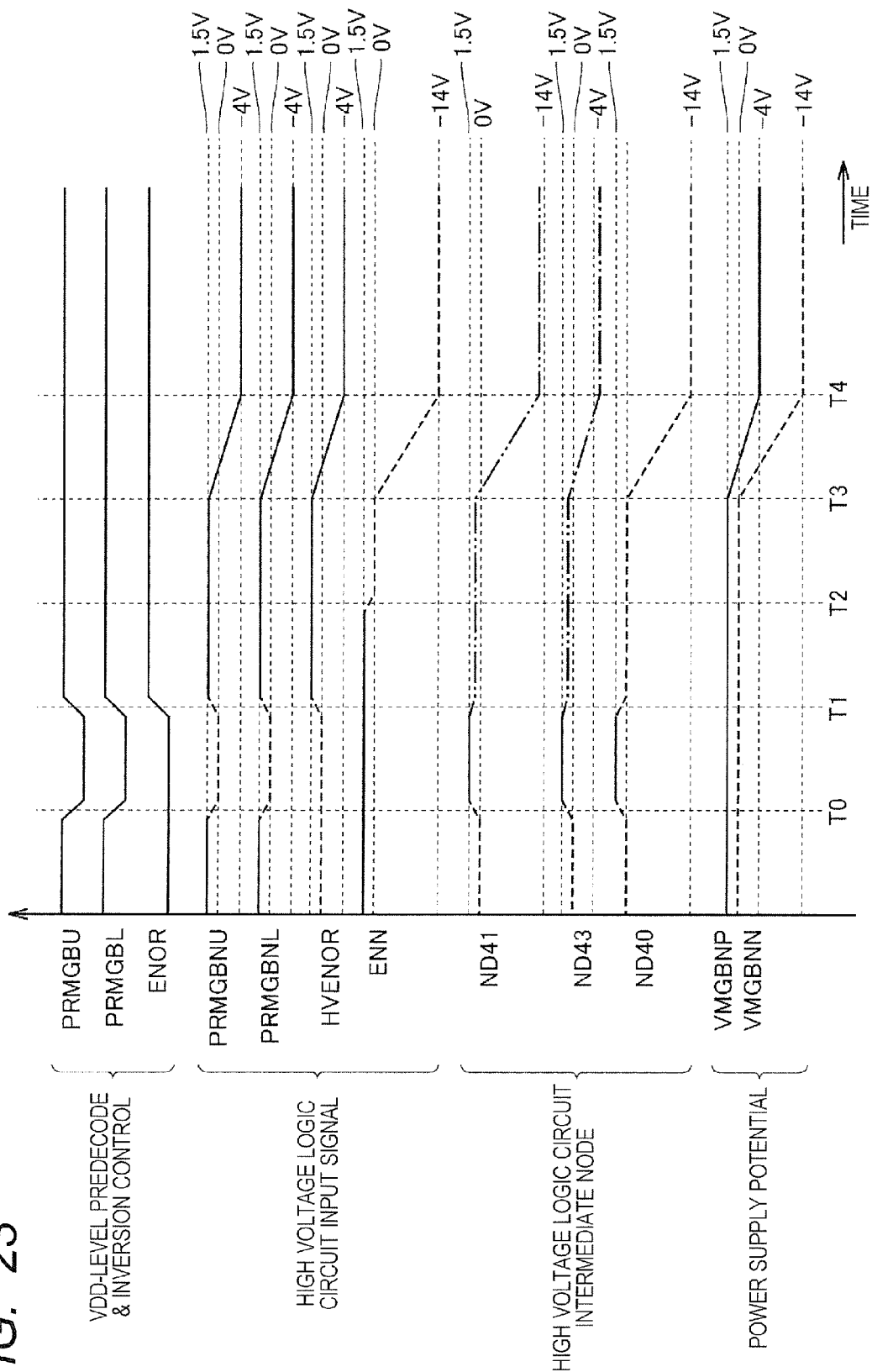
FIG. 23 is a timing chart illustrating an example of the voltage change of each part of the high voltage logic circuit illustrated in FIG. 21.

FIG. 23 is a timing chart illustrating an example of the voltage change of each part of the high voltage logic circuit 522A illustrated in FIG. 21. The timing chart illustrated in FIG. 23 corresponds to the timing chart illustrated in FIG. 22. That is, in FIG. 23, the time changes of the predecode signals PRMGBU and PRMGBL, the inversion control signal ENOR, the high voltage predecode signals PRMGBNU and PRMGBNL, the high voltage inverted control signal HVENOR, the cutoff signal ENN, and the power supply potentials VMGBNP and VMGBNN are the same as is the case of FIG. 22. The timing chart of FIG. 23 illustrates the time changes of the input signal to the high voltage logic circuit 522 and the voltage at the intermediate nodes ND40, ND41, and ND43, when the voltage to be outputted to the power supply line MGBN is reduced to −14V.

The NMOS transistor MN46 of FIG. 21 is set to OFF when the inversion control signal HVENOR is at an L level. The NMOS transistor MN46 is set to ON when the inversion control signal HVENOR is at an H level, and effectively charges the intermediate node ND41 up to a value obtained by adding the threshold voltage Vthn of the NMOS transistor MN46 to the voltage at the intermediate node ND40. The PMOS transistor MP47 is set to OFF when the predecode signal PRMGBNL is at an L level. The PMOS transistor MP47 is set to ON when the predecode signal PRMGBNL is at an H level, and effectively charges the intermediate node ND43 to a value obtained by subtracting the absolute value of the threshold voltage Vthp of the PMOS transistor MP47 from the potential of the predecode signal PRMGBNL.

According to the above characteristic, from time T0 to time T1 of FIG. 23, the inversion control signal HVENOR is at an L level and both the predecode signals PRMGBNU and PRMGBNL are at an L level. Accordingly, all the PMOS transistors MP40-MP44 become ON, and the NMOS transistors NM46 and the PMOS transistor MP47 become OFF. As a result, the voltage at all the intermediate nodes ND40, ND41, and ND43 becomes equal to the potential VMGBNP at the high-side power supply node ND45 (=1.5V). So far, it is the same as the case of FIG. 22.

At time T1, when the inversion control signal HVENOR changes to an H level, the predecode signals PRMGBNU and PRMGBNL also invert both from an L level to an H level (equal to the potential VMGBNP at the power supply node ND45). Accordingly, all the PMOS transistors MP40-MP44 are set to OFF. However, the NMOS transistor NM46 and the PMOS transistor MP47 are set to ON. Furthermore, all the NMOS transistors MN40-MN44 are set to ON. Accordingly, at time T1 or later, the potential at the intermediate node ND40 becomes equal to the potential VMGBNN of the low-side power supply node ND46. The potential at the intermediate node ND41 is clamped to a value obtained by adding the threshold voltage Vthn to the potential at the intermediate node ND40 (equal to the power supply potential VMGBNN). The potential at the intermediate node ND43 is clamped to a value obtained by subtracting the absolute value of the threshold voltage Vthp from the predecode signal PRMGBNL (equal to the high-side power supply potential VMGBNP).

Therefore, in the case of FIG. 23, the intermediate nodes ND41 and ND43 do not float unlike the case of FIG. 22, but the voltage changes with the change of the power supply potentials VMGNBP and VMGNBN. Specifically, from time T3 to time T4, the low-side power supply potential VMGBNN falls from 0V to −14V; accordingly, the potential at the intermediate node ND41 falls to −14V+Vthn. The high-side power supply potential VMGBNP falls from 1.5V to −4V; accordingly, the potential at the intermediate node ND43 falls to −4V+Vthp=−4V−Vthn. Accordingly, the highest voltage applied to the PMOS transistor MP44 becomes −4V−Vthn−(−14V)=10V−Vthn; therefore, it is possible to restrict the highest voltage within the withstand voltage of the MOS transistor.

(Operation of the High Voltage Logic Circuit 522A of FIG. 21 - - - a Case of Raising the High-Side Power Supply Potential)

The above-described explanation of FIG. 22 and FIG. 23 is about the case of reducing the potential at the low-side power supply node ND46. On the contrary, a case of raising the potential VMGBNP at the high-side power supply node ND45 illustrated in FIG. 21 is explained.

First, as illustrated in FIG. 21, when the inversion control signal HVENOR is at an L level (non-active), the PMOS transistor MP46 is set to ON, and effectively charges the intermediate node ND42 up to a value obtained by subtracting the absolute value of the threshold voltage Vthp of the PMOS transistor MP46 from the potential at the intermediate node ND40. The PMOS transistor MP48 is set to ON with the rise of the low-side power supply potential VMGBNN, and effectively charges the intermediate node ND44 up to a value obtained by subtracting the absolute value of the threshold voltage Vthp of the PMOS transistor MP48 from the power supply potential VMGBNN.

Accordingly, it is assumed, for example, that the potential of the high-side power supply node ND45 rises from 1.5V to 14V, and that the potential of the low-side power supply node ND46 rises from 0V to 4V, in the state where the predecode signals PRMGBNU and PRMGBNL and the inversion control signal HVENOR are at an L level. Then, the potential at the intermediate node ND42 rises to 14V−Vthn, and the potential at the intermediate node ND44 rises to 4V+Vthp=4V−Vthn. Accordingly, the highest voltage applied to the NMOS transistor MN44 becomes 14V−(4V−Vthn)=10V+Vthn; therefore, it is possible to restrict the highest voltage mostly within the withstand voltage of the MOS transistor. In this way, with the help of the clamp PMOS transistors MP46 and MP48, it is possible to clamp the potential at the intermediate nodes ND42 and ND44, thereby avoiding the violation of the withstand voltage.

[Summary of Embodiment 2]

In Embodiment 2, the clamp MOS transistors MN46, MP46, MP47, and MP48 for clamping the intermediate nodes ND41, ND42, ND43, and ND44 are respectively added to the high voltage logic circuit 522 provided in the semiconductor device according to Embodiment 1. Accordingly, even when the potential at the power supply node of the high voltage logic circuit swings with respect to the ground potential so greatly that it exceeds the withstand voltage of the MOS transistor, the intermediate nodes ND41, ND42, ND43, and ND44 of the high voltage logic circuit 522A follow the change of the power supply potential. Therefore, these intermediate nodes become floating without maintaining the initial potential. As a result, it is possible to avoid the violation of the withstand voltage of the MOS transistor.

From the viewpoint of the operating sequence, when there is no necessity of generating a positive high voltage, the clamp MOS transistors MP46 and MP48 can be omitted, and when there is no necessity of generating a negative high voltage, the clamp MOS transistors MN46 and MP47 can be omitted.

As described above, the invention accomplished by the present inventors has been concretely explained based on the embodiments. However, it is needless to say that the present invention is not restricted to the embodiments as described above, and it can be changed variously in the range which does not deviate from the gist.

What is claimed is:

1. A semiconductor device comprising:
a memory array provided with electrically rewritable nonvolatile memory cells arranged in a matrix;
a driver circuit operable to drive a plurality of word lines each corresponding to a row of the memory array; and
a decode circuit operable to generate a plurality of selection signals to select each of the word lines based on a plurality of predecode signals, and operable to supply the generated selection signals to the driver circuit, wherein the decode circuit comprises:

a plurality of first logic gates each operable to invert a logical level of the corresponding predecode signal according to an operation mode;

a plurality of first level shifters each operable to convert one of the corresponding predecode signal and its inverted signal into a step-up signal of a voltage level according to the operation mode; and a plurality of first logic circuits operable to generate the selection signal by performing a logical operation of the corresponding step-up signals among the step-up signals respectively outputted from the first level shifters, and wherein each of the first logic circuits performs a different logical operation according to the operation mode, wherein the memory array is divided into a plurality of blocks every plurality of rows of the memory array, wherein the driver circuit comprises:

a plurality of driver groups respectively corresponding to the blocks, wherein each of the driver groups comprises:

a first power supply line on a low potential side;

a second power supply line on a high potential side; and a plurality of drivers operating with a voltage supplied from the first power supply line and the second power supply line, and each operable to drive a memory cell of the corresponding row of the corresponding block, wherein the decode circuit comprises:

a first decode circuit operable to supply a first power supply potential to the first power supply line of each of the driver groups; and a second decode circuit operable to supply a second power supply potential to the second power supply line of each of the driver groups, and wherein the first decode circuit comprises:

the first logic gates;

the first level shifters; and the first logic circuits each operable to supply the first power supply potential to the corresponding first power supply line as the selection signal, wherein the second decode circuit comprises:

a plurality of second level shifters each operable to convert the corresponding predecode signal into a step-up signal of a voltage level according to the operation mode; and a plurality of second logic circuits each operable to perform a logical operation of the corresponding step-up signals among the step-up signals respectively outputted from the second level shifters to generate the second power supply potential, and operable to supply the generated second power supply potential to the corresponding second power supply line as the selection signal, and wherein each of the second logic circuits performs the same logical operation irrespective of the operation mode.

2. The semiconductor device according to claim 1, wherein each of the drivers of each of the driver groups supplies the potential of one of the first power supply line and the second power supply line, to the corresponding word line according to a gate control signal,
wherein the decode circuit comprises:
a third decode circuit provided in common to the driver groups and operable to supply the gate control signal to each of the drivers configuring each of the driver groups,
wherein the third decode circuit comprises:
a plurality of second logic gates each operable to invert a logical level of the corresponding predecode signal according to an operation mode;
a plurality of third level shifters each operable to convert one of the corresponding predecode signal and its inverted signal into a step-up signal of a voltage level according to the operation mode; and
a plurality of third logic circuits each operable to perform a logical operation of the corresponding step-up signals among the step-up signals respectively outputted from the third level shifters to generate the gate control signal, and operable to supply the generated gate control signal to the corresponding driver as the selection signal, and
wherein each of the third logic circuits performs a different logical operation according to the operation mode.

3. The semiconductor device according to claim 1,
wherein each of the drivers comprises:
a CMOS (Complementary Metal Oxide Semiconductor) inverter,
wherein the decode circuit comprises:
the first decode circuit operable to supply a first gate signal to a gate of an N-type transistor configuring each of the CMOS inverters; and
the second decode circuit operable to supply a second gate signal to a gate of a P-type transistor configuring each of the CMOS inverters, and
wherein the first decode circuit further comprises:
the first logic circuits operable to supply the first gate signal to the corresponding driver as the selection signal.

4. A semiconductor device comprising:
a memory array provided with electrically rewritable nonvolatile memory cells arranged in a matrix;
a driver circuit operable to drive a plurality of word lines each corresponding to a row of the memory array; and
a decode circuit operable to generate a plurality of selection signals to select each of the word lines based on a plurality of predecode signals, and operable to supply the generated selection signals to the driver circuit,
wherein the decode circuit comprises:
a plurality of first logic gates each operable to invert a logical level of the corresponding predecode signal according to an operation mode;
a plurality of first level shifters each operable to convert one of the corresponding predecode signal and its inverted signal into a step-up signal of a voltage level according to the operation mode; and
a plurality of first logic circuits operable to generate the selection signal by performing a logical operation of the corresponding step-up signals among the step-up signals respectively outputted from the first level shifters,
wherein each of the first logic circuits performs a different logical operation according to the operation mode,
wherein the driver circuit comprises:
a first power supply line on a low potential side;
a second power supply line on a high potential side; and
a plurality of drivers operating with a voltage supplied from the first power supply line and the second power supply line, and each operable to drive a memory cell of the corresponding row,
wherein each of the drivers comprises:
a CMOS (Complementary Metal Oxide Semiconductor) inverter,
wherein the decode circuit comprises:
a first decode circuit operable to supply a first gate signal to agate of an N-type transistor configuring each of the CMOS inverters; and
a second decode circuit operable to supply a second gate signal to a gate of a P-type transistor configuring each of the CMOS inverters, and
wherein the first decode circuit comprises:
the first logic gates;
the first level shifters; and
the first logic circuits operable to supply the first gate signal to the corresponding driver as the selection signal,
wherein the second decode circuit comprises:
a plurality of second level shifters each operable to convert the corresponding predecode signal into a step-up signal of a voltage level according to the operation mode; and
a plurality of second logic circuits each operable to perform a logical operation of the corresponding step-up signals among the step-up signals respectively outputted from the second level shifters to generate the second gate signal, and operable to supply the generated second gate signal to the corresponding driver as the selection signal, and
wherein each of the second logic circuits performs the same logical operation irrespective of the operation mode.

5. The semiconductor device according to claim 1,
wherein each of the drivers supplies the potential of one of the first power supply line and the second power supply line, to the corresponding word line according to the corresponding selection signal.

6. The semiconductor device according to claim 1,
wherein the semiconductor device has, as the operation mode, a write mode in which data is written in the selected memory cell and an erasing mode in which the written data of the selected memory cell is erased,
wherein, in the write mode, the second decode circuit sets the second power supply potential at a higher potential than at the time of data read,
wherein, in the erasing mode, the first decode circuit sets the first power supply potential at a negative potential,
wherein the first logic gate does not invert the logical level of the corresponding predecode signal in the write mode, but inverts the logical level of the corresponding predecode signal in the erasing mode, and
wherein the first logic circuit performs an AND operation as the logical operation in the write mode, and performs an OR operation as the logical operation in the erasing mode.

7. The semiconductor device according to claim 5,
wherein the semiconductor device has, as the operation mode, a write mode in which data is written in the selected memory cell and an erasing mode in which the written data of the selected memory cell is erased,
wherein, in the write mode, the potential of the second power supply line is set at a higher potential than in reading, wherein, in the erasing mode, the potential of the first power supply line is set at a negative potential, wherein the first logic gate does not invert the logical level of the corresponding predecode signal in the write mode, but inverts the logical level of the corresponding predecode signal in the erasing mode, and wherein the first logic circuit performs an NAND operation as the logical operation in the write mode, and performs an NOR operation as the logical operation in the erasing mode.

8. The semiconductor device according to claim 6, wherein the first logic circuit comprises:

first and a second N-type transistors coupled in series between the first power supply line and an output node;

third and a fourth N-type transistors coupled in series between the first power supply line and the output node and coupled in parallel to the whole of the first and the second N-type transistors;

a fifth N-type transistor coupled in parallel with the fourth N-type transistor;

first and a second P-type transistors coupled in series between the second power supply line and the output node;

third and a fourth P-type transistors coupled in series between the second power supply line and the output node and coupled in parallel to the whole of the first and the second P-type transistors; and a fifth P-type transistor coupled in parallel with the fourth P-type transistor, wherein one of a first predecode signal stepped up and its inverted signal is supplied to each gate of the first and the fourth N-type transistors and the first and the fourth P-type transistors, wherein one of the second predecode signal stepped up and its inverted signal is supplied to each gate of the second and the fifth N-type transistors and the second and the fifth P-type transistors, wherein an inversion control signal is supplied to each gate of the third P-type transistor and the third N-type transistor, and wherein the inversion control signal becomes a low level in the write mode, and becomes a high level in the erasing mode.

9. The semiconductor device according to claim 8, wherein the first logic circuit further comprises:

a sixth transistor coupled between a first intermediate node between the first and the second N-type transistors, and the first power supply line;

a seventh transistor coupled between a second intermediate node between the first and the second P-type transistors, and the second P-type transistor;

an eighth transistor coupled between a third intermediate node between the third and the fourth N-type transistors, and the output node; and a ninth transistor coupled between a fourth intermediate node between the third and the fourth P-type transistors, and the output node.

10. A semiconductor device comprising:

a memory array provided with electrically rewritable nonvolatile memory cells arranged in a matrix, wherein the memory array comprises:

a plurality of word lines each corresponding to a row of the memory array, and is divided into a plurality of blocks every plurality of rows of the memory array, wherein the semiconductor device further comprises:

a driver circuit operable to drive the word lines, wherein the driver circuit comprises:

a plurality of driver groups respectively corresponding to the blocks, wherein each of the driver groups comprises:

a first power supply line on a low potential side;

a second power supply line on a high potential side; and a plurality of drivers operable to drive respectively the word lines provided in the corresponding block, wherein the semiconductor device further comprises:

a first decode circuit operable to supply a first power supply potential according to the operation mode to each of the first power supply lines, based on a plurality of first predecode signals, wherein the first decode circuit comprises:

a plurality of first logic gates each operable to invert a logical level of the corresponding first predecode signal according to the operation mode;

a plurality of first level shifters each operable to convert one of the corresponding first predecode signal and its inverted signal into a step-up signal of a voltage level according to the operation mode; and a plurality of first logic circuits each operable to perform a logical operation of the corresponding step-up signals among the step-up signals respectively outputted from the first level shifters to generate the first power supply potential, and operable to supply the generated first power supply potential to the corresponding first power supply line, and wherein each of the first logic circuits performs a different logical operation according to the operation mode, said semiconductor device further comprising:

a second decode circuit operable to supply a second power supply potential according to the operation mode to each of the second power supply lines, based on the first predecode signals, wherein the second decode circuit comprises:

a plurality of second level shifters each operable to convert one of the corresponding first predecode signal and its inverted signal into a step-up signal of a voltage level according to the operation mode; and a plurality of second logic circuits each operable to perform a logical operation of the corresponding step-up signals among the step-up signals respectively outputted from the second level shifters to generate the second power supply potential, and operable to supply the generated second power supply potential to the corresponding second power supply line, and wherein each of the second logic circuits performs the same logical operation irrespective of the operation mode.

11. The semiconductor device according to claim 10, wherein each of the driver of each of the driver groups receives a gate control signal common in the driver groups, and supplies the potential of one of the first power supply line and the second power supply line, to the corresponding word line according to the gate control signal, wherein the semiconductor device further comprises:

a third decode circuit operable to supply the gate control signal of a voltage level according to the operation mode to each of the driver of each of the driver groups, based on the second predecode signals, wherein the third decode circuit comprises:

a plurality of second logic gates each operable to invert a logical level of the corresponding second predecode signal according to the operation mode;

a plurality of third level shifters each operable to convert one of the corresponding second predecode signal and its inverted signal into a step-up signal of a voltage level according to the operation mode; and a plurality of third logic circuits each operable to perform a logical operation of the corresponding step-up signals among the step-up signals respectively outputted from the third level shifters to generate the gate control signal, and operable to supply the generated gate control signal to the corresponding driver, and wherein each of the third logic circuits performs a different logical operation according to the operation mode.

* * * * *